US011909274B2

(12) United States Patent
Morimoto

(10) Patent No.: US 11,909,274 B2
(45) Date of Patent: Feb. 20, 2024

(54) ELECTRIC DRIVING DEVICE, ELECTRIC POWER STEERING DEVICE, AND METHOD FOR MANUFACTURING ELECTRONIC CONTROL UNIT

(71) Applicant: NSK Ltd., Tokyo (JP)

(72) Inventor: Masakazu Morimoto, Tokyo (JP)

(73) Assignee: NSK LTD., Tokyo (JP)

( * ) Notice: Subject to any disclaimer, the term of this patent is extended or adjusted under 35 U.S.C. 154(b) by 26 days.

(21) Appl. No.: 17/802,296

(22) PCT Filed: Feb. 10, 2022

(86) PCT No.: PCT/JP2022/005263
§ 371 (c)(1),
(2) Date: Aug. 25, 2022

(87) PCT Pub. No.: WO2022/172974
PCT Pub. Date: Aug. 18, 2022

(65) Prior Publication Data
US 2023/0118691 A1  Apr. 20, 2023

(30) Foreign Application Priority Data

Feb. 10, 2021 (JP) .................................. 2021-019895
Aug. 31, 2021 (JP) .................................. 2021-140810

(51) Int. Cl.
*H02K 11/33* (2016.01)
*B62D 5/04* (2006.01)
(Continued)

(52) U.S. Cl.
CPC ............. *H02K 11/33* (2016.01); *B62D 5/046* (2013.01); *H02K 5/225* (2013.01); *H02K 21/16* (2013.01);
(Continued)

(58) Field of Classification Search
CPC ........ H02K 11/33; H02K 5/225; H02K 21/16; H02K 2211/03; B62D 5/046; H05K 1/14;
(Continued)

(56) References Cited

U.S. PATENT DOCUMENTS 8,866,357 B2   10/2014   Yamasaki et al.
8,963,388 B2   2/2015    Miyachi et al.
(Continued)

FOREIGN PATENT DOCUMENTS

CN     103368337 A    10/2013
CN     106856667 A    6/2017
(Continued)

OTHER PUBLICATIONS

Office Action dated Dec. 6, 2022 issued by the Chinese Patent Office in Chinese Application No. 202280002896.X.
(Continued)

*Primary Examiner* — John K Kim
(74) *Attorney, Agent, or Firm* — Sughrue Mion, PLLC

(57) ABSTRACT

An electric driving device and an electric power steering device. An electric driving device includes a motor and an electronic control unit that controls rotation of the motor. The electronic control unit includes a first circuit board, a second circuit board, a second housing, a lid, and an inter-board connector. The second circuit board includes a control circuit that controls an electric current supplied to a transistor of the first circuit board. The second housing accommodates the second circuit board and has a first through hole passing therethrough in the axial direction. The lid covers the second housing. The inter-board connector connects the second circuit board disposed on the anti-load side of the second housing to the first circuit board disposed on the load side of the second housing. The inter-board connector is disposed in the first through hole.

7 Claims, 27 Drawing Sheets

(51) Int. Cl.
  *H02K 21/16* (2006.01)
  *H02K 5/22* (2006.01)
  *H05K 1/14* (2006.01)
  *H05K 1/18* (2006.01)
  *H05K 7/14* (2006.01)

(52) U.S. Cl.
  CPC .............. *H05K 1/14* (2013.01); *H05K 1/181* (2013.01); *H05K 7/1432* (2013.01); *H02K 2211/03* (2013.01); *H05K 2201/1009* (2013.01); *H05K 2201/10151* (2013.01); *H05K 2201/10166* (2013.01)

(58) Field of Classification Search
  CPC .............. H05K 1/181; H05K 7/1432; H05K 2201/1009; H05K 2201/10151; H05K 2201/10166
  USPC ........................................ 310/68 B, 68 R, 71
  See application file for complete search history.

(56) References Cited

U.S. PATENT DOCUMENTS

| | | | |
|---|---|---|---|
| 10,211,705 | B2 | 2/2019 | Hayashi |
| 10,211,771 | B2 | 2/2019 | Yamasaki |
| 10,742,096 | B2 | 8/2020 | Maeshima |
| 10,897,219 | B2 | 1/2021 | Yamasaki |
| 11,050,325 | B2 | 6/2021 | Sato |
| 11,052,841 | B2 | 7/2021 | Fujimoto et al. |
| 11,239,723 | B2 | 2/2022 | Funk et al. |
| 11,260,899 | B2 | 3/2022 | Kawata |
| 2012/0286605 | A1* | 11/2012 | Miyachi ................ H02K 11/33 310/71 |
| 2012/0307476 | A1 | 12/2012 | Masuzawa et al. |
| 2013/0099609 | A1* | 4/2013 | Ikeno ..................... H02K 11/33 310/68 B |
| 2013/0099611 | A1* | 4/2013 | Suga ..................... H02K 5/225 310/71 |
| 2013/0181550 | A1* | 7/2013 | Li .......................... H02K 3/522 310/43 |
| 2013/0257232 | A1* | 10/2013 | Tomizawa ............ H02K 29/08 310/68 R |
| 2014/0028161 | A1* | 1/2014 | Kamogi ................ H02K 11/33 361/803 |
| 2016/0065030 | A1 | 3/2016 | Fujimoto |
| 2016/0094104 | A1* | 3/2016 | Yamasaki ............ H02K 11/33 310/68 D |
| 2016/0094175 | A1 | 3/2016 | Yamasaki |
| 2016/0134178 | A1 | 5/2016 | Acinas Lope et al. |
| 2016/0380518 | A1* | 12/2016 | Deubler ................ H02K 11/25 310/68 C |
| 2017/0305456 | A1 | 10/2017 | Iwabuki et al. |
| 2018/0093698 | A1* | 4/2018 | Urimoto ............ H02K 15/0062 |
| 2018/0115225 | A1 | 4/2018 | Togawa et al. |
| 2018/0131256 | A1 | 5/2018 | Fujimoto |
| 2019/0131847 | A1 | 5/2019 | Funk et al. |
| 2019/0207488 | A1 | 7/2019 | Ichikawa et al. |
| 2023/0118691 | A1* | 4/2023 | Morimoto .............. H02K 11/33 310/71 |

FOREIGN PATENT DOCUMENTS

| | | |
|---|---|---|
| CN | 107408871 A | 11/2017 |
| CN | 109690921 A | 4/2019 |
| DE | 11 2016 000 624 T5 | 11/2017 |
| EP | 3 484 027 A1 | 5/2019 |
| EP | 3 512 078 A1 | 7/2019 |
| JP | 2012-152091 A | 8/2012 |
| JP | 2012-239296 A | 12/2012 |
| JP | 2014-75866 A | 4/2014 |
| JP | 2014-151850 A | 8/2014 |
| JP | 2016-140150 A | 8/2016 |
| JP | 2017-159771 A | 9/2017 |
| JP | 2017-189034 A | 10/2017 |
| JP | 2018-207640 A | 12/2018 |
| JP | 2018-207641 A | 12/2018 |
| JP | 2019-068542 A | 4/2019 |
| JP | 2019-088162 A | 6/2019 |
| JP | 2019-092385 A | 6/2019 |
| JP | 2019-134679 A | 8/2019 |
| JP | 2019-193453 A | 10/2019 |
| JP | 2020-127334 A | 8/2020 |
| JP | 2021-2928 A | 1/2021 |
| WO | 2018/047342 A1 | 3/2018 |
| WO | 2020/130107 A1 | 6/2020 |
| WO | 2020/162530 A1 | 8/2020 |
| WO | 2020/188934 A1 | 9/2020 |
| WO | 2022/172977 A1 | 8/2022 |

OTHER PUBLICATIONS

International Search Report for PCT/JP2022/005266 dated, Apr. 19, 2022.
Written Opinion of the International Searching Authority dated Apr. 19, 2022 in International Application No. PCT/JP2022/005266.
International Search Report of PCT/JP2022/005267 dated Apr. 26, 2022.
Written Opinion of PCT/JP2022/005267 dated Apr. 26, 2022.
Japanese Patent Office Decision to Grant a Patent for JP 2022-541206 dated Aug. 2, 2022.
International Search Report for PCT/JP2022/005263 dated Apr. 26, 2022.
Written Opinion for PCT/JP2022/005263 dated Apr. 26, 2022.
European Search Report dated Aug. 1, 2023 in European Application No. 22752799.1.
Communication dated Oct. 28, 2023, issued by the Chinese Patent Office in Chinese Application No. 202280002897.4.
Supplementary European Search Report issued by the European Patent Application No. 22752796.7, dated Oct. 28, 2023.

* cited by examiner

ELECTRIC DRIVING DEVICE, ELECTRIC POWER STEERING DEVICE, AND METHOD FOR MANUFACTURING ELECTRONIC CONTROL UNIT

CROSS REFERENCE TO RELATED APPLICATIONS

This application is a National Stage of International Application No. PCT/JP2022/005263 filed Feb. 10, 2022, claiming priorities based on Japanese Patent Application No. 2021-019895 filed Feb. 10, 2021 and Japanese Patent Application No. 2021-140810 filed Aug. 31, 2021.

FIELD

The present disclosure relates to an electric driving device and an electric power steering device including an electronic control unit that controls rotation of a motor, and a method for manufacturing the electronic control unit.

BACKGROUND

Electric power steering devices that generate auxiliary steering torque by a motor include an electronic control unit serving as a device that controls the motor. Patent Literature 1, for example, describes a driving device that integrates a motor and a control unit that controls the motor.

CITATION LIST

Patent Literature

Patent Literature 1: Japanese Patent Application Laid-open No. 2018-207640

SUMMARY

Technical Problem

In the electric driving device described in Patent Literature 1, field-effect transistors (FET) that drive the motor are mounted on a power circuit board to reduce the height of a power module. As the electric power for driving the motor increases, it is necessary to increase power supply wiring in the board, resulting in an increase in the area of the board. For this reason, it is desirable to reduce the number of pieces of power supply wiring in the board.

To make heat generated by the field-effect transistor less likely to affect operations of a control circuit that controls an electric current of the field-effect transistor, the circuit board provided with the field-effect transistor and the control circuit board provided with the control circuit are separated. This configuration increases the reliability of the control circuit.

To further increase the reliability of the control circuit, it is desirable to dissipate heat generated in the control circuit board. In addition, it is necessary to transmit control signals between the control circuit board and the power circuit board via an inter-board connector.

In view of the disadvantages described above, an object of the present disclosure is to provide an electric driving device and an electric power steering device that reliably transmit control signals and enhance heat dissipation of a first circuit board and a second circuit board, and a method for manufacturing an electronic control unit.

Solution to Problem

To achieve the above object, an electric driving device according to an embodiment comprising a motor and an electronic control unit configured to control rotation of the motor, wherein the motor comprises: a shaft extending from a load side to an anti-load side in an axial direction; a motor rotor configured to synchronize with the shaft; a motor stator comprising a motor coil and motor coil wiring for supplying electric power to the motor coil and configured to rotate the motor rotor; a first housing that accommodates the motor rotor and the motor stator; and a magnet provided on the anti-load side of the shaft, and the electronic control unit comprises: a first circuit board provided with a transistor configured to output an electric current to excite the motor coil and a rotation angle sensor disposed on an extension of the axial direction of the shaft, the first circuit board being disposed on the anti-load side of the shaft; a second circuit board comprising a control circuit configured to control an electric current supplied to the transistor; a second housing that accommodates the second circuit board and has a first through hole passing through the second housing in the axial direction; a lid that covers the second housing; and an inter-board connector that connects the second circuit board disposed on the anti-load side of the second housing to the first circuit board disposed on the load side of the second housing and is disposed in the first through hole.

With this configuration, the inter-board connector reliably transmits control signals, and the second housing enhances heat dissipation of the first circuit board and the second circuit board.

As a desirable embodiment, the electric driving device further comprising: a power supply wiring module configured by molding, with resin, a coil for noise removal, a capacitor, and wiring configured to supply electric power to at least one of the first circuit board and the second circuit board, wherein the second housing has a second through hole formed in the axial direction at a position different from a position of the first through hole, and a power supply terminal extending from the power supply wiring module passes through the second through hole and is connected to the first circuit board. As the electric power for driving the motor increases, it is necessary to increase power supply wiring in the board, resulting in an increase in the area of the board. For this reason, it is desirable to reduce the number of pieces of power supply wiring in the board. The area of the power supply wiring in the first circuit board is reduced because the power supply wiring is provided in the power supply wiring module. As a result, the area of the first circuit board is reduced, whereby the size of the electronic control unit is reduced in the radial direction.

As a desirable embodiment, the electric driving device further comprising: a heat sink sandwiched between the power supply wiring module and the second circuit board, wherein the second housing accommodates the second circuit board, the heat sink, and the power supply wiring module. With this configuration, heat generation in the control circuit is suppressed. As a result, the life of the second circuit board is extended, and the reliability of the electric driving device is improved.

As a desirable embodiment, the second housing has a plurality of flanges extending outward in a radial direction of the second housing and a third through hole formed in at least one of the flanges, and the lid has a fourth through hole at a position overlapping the third through hole in the axial direction in the lid. With this configuration, the third through hole and the fourth through hole serve as the reference for positioning the lid with respect to the second housing and facilitates assembling the second housing and the lid.

As a desirable embodiment, the second housing has a female thread formed in at least one of the flanges, the lid has a fifth through hole at a position overlapping the female thread in the axial direction in the lid, and the lid and the second housing are fixed by fastening a fixing member with a male thread passing through the fifth through hole to the female thread. This configuration can prevent the lid from being misaligned with respect to the second housing in fastening work, thereby suppressing stress on the inter-board connector.

As a desirable embodiment, the inter-board connector comprises a receptacle attached to the first circuit board and a plug attached to the second circuit board, and a position of the plug with respect to the receptacle is displaceable. While the inter-board connector allows displacement of the plug with respect to the receptacle, it is attached so as to suppress variation in the position of the plug with respect to the receptacle.

As a desirable embodiment, an electric power steering device comprising: an electric driving device above, wherein the electric driving device generates auxiliary steering torque. With this configuration, the size of the electric power steering device is reduced in the radial direction orthogonal to the axial direction with respect to the shaft of the motor, and the flexibility in the arrangement of the electric power steering device is increased. The reliability of the electric power steering device is improved because the reliability of the electric driving device is improved.

To achieve the above object, a method according to an embodiment for manufacturing an electronic control unit attached to a motor to control rotation of the motor, the method comprising: a preparation process of preparing: a first circuit board provided with a transistor configured to output an electric current to excite a motor coil of the motor, a rotation angle sensor configured to detect a rotation angle of a shaft of the motor, and a receptor of an inter-board connector; a second circuit board provided with a control circuit configured to control an electric current supplied to the transistor and a plug of the inter-board connector; a housing having a bottom, a side wall surrounding the bottom, a through hole of the bottom passing through the bottom, a plurality of flanges extending outward from the side wall, and a through hole of one of the flanges passing through the flange; and a lid serving as a lid covering the housing and having a through hole of the lid at a position corresponding to the through hole of the flange; a first process of attaching, after the preparation process, the first circuit board to the housing so as to dispose the receptor inside the through hole of the bottom; a second process of preparing, after the first process, a jig having a pin protruding from the jig, inserting the pin through the through hole of the flange and causing the pin to protrude from the flange, and attaching the housing to the jig; a third process of attaching, after the preparation process, the second circuit board to the lid; a fourth process of passing, after the second process and the third process, the pin protruding from the flange through the through hole of the lid and fitting the plug into the receptor; and a fifth process of fastening, after the fourth process, the lid and the housing with a bolt.

While the inter-board connector allows displacement of the plug with respect to the receptacle, it is attached so as to suppress variation in the position of the plug with respect to the receptacle.

Advantageous Effects of Invention

The present disclosure can provide an electric driving device and an electric power steering device that reliably transmit control signals and enhance heat dissipation of a first circuit board and a second circuit board, and a method for manufacturing an electronic control unit.

DESCRIPTION OF EMBODIMENTS

Aspects (embodiments) for embodying the present invention are described in detail with reference to the drawings. The contents described in the embodiments below are not intended to limit the present invention. Components described below include components easily conceivable by those skilled in the art and components substantially identical therewith. In addition, the components described below can be appropriately combined.

Figure 1:
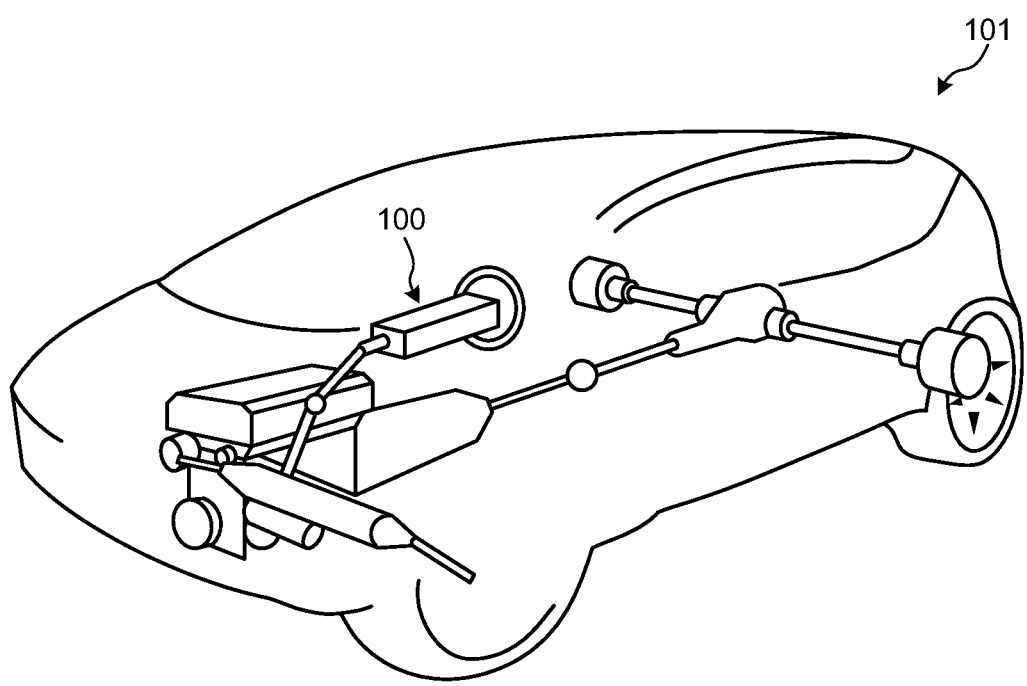
FIG. 1 is a perspective view schematically illustrating a vehicle provided with an electric power steering device according to an embodiment.
Figure 2:
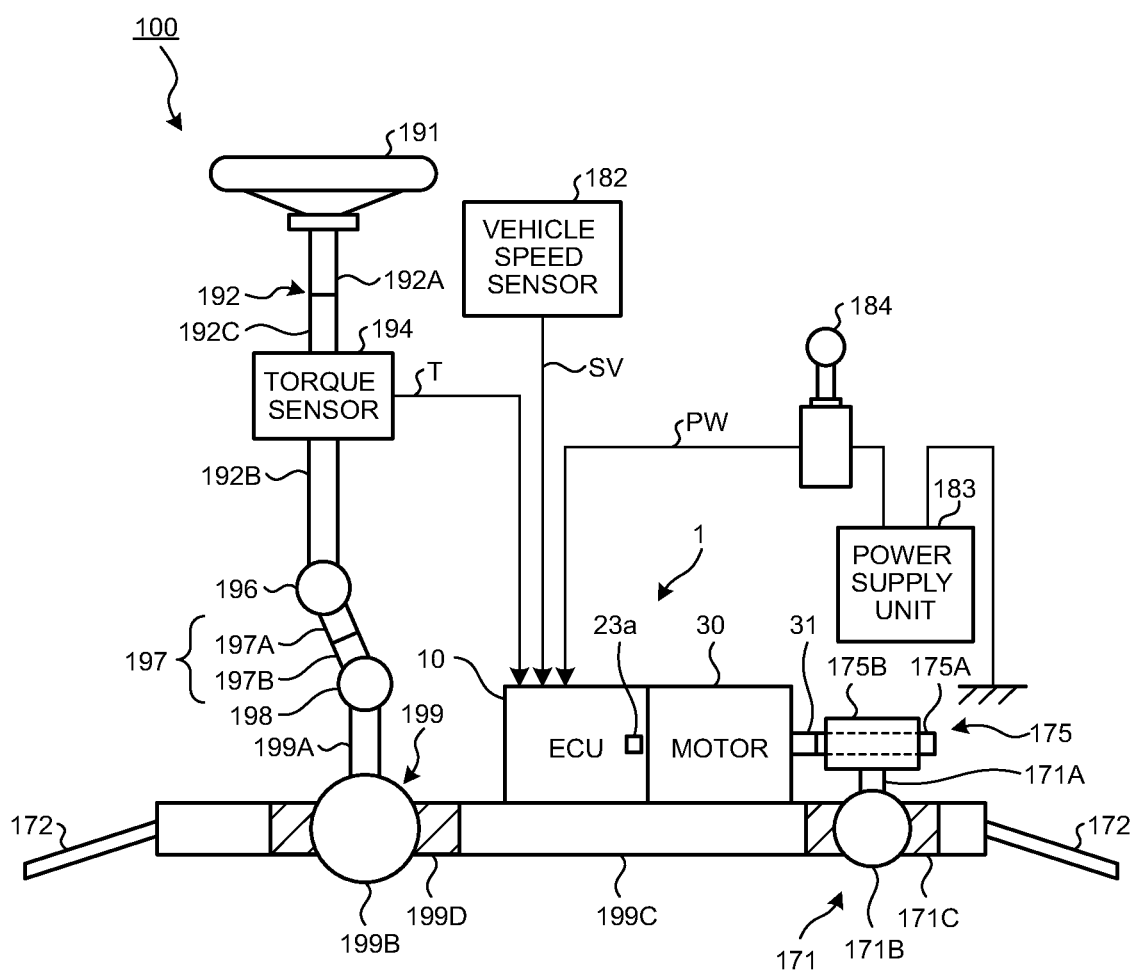
FIG. 2 is a schematic of the electric power steering device according to the embodiment.

FIG. 1 is a perspective view schematically illustrating a vehicle provided with an electric power steering device according to an embodiment. FIG. 2 is a schematic of the electric power steering device according to the embodiment. As illustrated in FIG. 1, a vehicle 101 is provided with an electric power steering device 100. An outline of the electric power steering device 100 is described with reference to FIG. 2

The electric power steering device 100 includes a steering wheel 191, a steering shaft 192, a universal joint 196, an intermediate shaft 197, a universal joint 198, a first rack-and-pinion mechanism 199, and tie rods 172 in order of transmission of force applied by a driver (operator). The electric power steering device 100 also includes a torque sensor 194 that detects steering torque of the steering shaft 192, a motor 30, an electronic control unit (hereinafter referred to as ECU) 10 that controls the motor 30, a reduction gear 175, and a second rack-and-pinion mechanism 170. A vehicle speed sensor 182, a power supply unit 183 (e.g., an in-vehicle battery), and an ignition switch 184 are provided to the vehicle body. The vehicle speed sensor 182 detects the travel speed of the vehicle 101. The vehicle speed sensor 182 outputs detected vehicle speed signals SV to the ECU 10 by CAN (controller area network) communications. The ECU 10 is supplied with electric power from the power supply unit 183 when the ignition switch 184 is on.

An electric driving device 1 includes the motor 30 and the ECU 10 fixed to an anti-load side of a shaft 31 of the motor 30. The electric driving device 1 may also include an adapter that connects the ECU 10 to the motor 30.

As illustrated in FIG. 2, the steering shaft 192 includes an input shaft 192A, an output shaft 192B, and a torsion bar 192C. The input shaft 192A is connected to the steering wheel 191 at one end and to the torsion bar 192C at the other end. The output shaft 192B is connected to the torsion bar 192C at one end and to the universal joint 196 at the other end. The torque sensor 194 detects torsion of the torsion bar 192C, thereby detecting the steering torque applied to the steering shaft 192. The torque sensor 194 outputs steering torque signals T corresponding to the detected steering torque to the ECU 10. The steering shaft 192 is rotated by the steering force applied to the steering wheel 191.

The intermediate shaft 197 includes an upper shaft 197A and a lower shaft 197B and transmits torque of the output shaft 192B. The upper shaft 197A is connected to the output shaft 192B with the universal joint 196 interposed therebetween. By contrast, the lower shaft 197B is connected to a first pinion shaft 199A of the first rack-and-pinion mechanism 199 with the universal joint 198 interposed therebetween. The upper shaft 197A and the lower shaft 197B are splined to each other, for example.

The first rack-and-pinion mechanism 199 includes the first pinion shaft 199A, a first pinion gear 199B, a rack shaft 199C, and a first rack 199D. The first pinion shaft 199A is connected to the lower shaft 197B at one end with the universal joint 198 interposed therebetween and to the first pinion gear 199B at the other end. The first rack 199D formed on the rack shaft 199C meshes with the first pinion gear 199B. Rotational motion of the steering shaft 192 is transmitted to the first rack-and-pinion mechanism 199 via the intermediate shaft 197. The rotational motion is converted into linear motion of the rack shaft 199C by the first rack-and-pinion mechanism 199. The tie rods 172 are connected to respective ends of the rack shaft 199C.

The motor 30 is a motor that generates auxiliary steering torque for assisting the driver in steering. The motor 30 may be a brushless motor or a brushed motor with brushes and a commutator.

The ECU 10 includes a rotation angle sensor 23a. The rotation angle sensor 23a detects the rotation phase of the motor 30. The ECU 10 acquires rotation phase signals of the motor 30 from the rotation angle sensor 23a, the steering torque signals T from the torque sensor 194, and the vehicle speed signals SV of the vehicle 101 from the vehicle speed sensor 182. The ECU 10 calculates an auxiliary steering command value of an assist command based on the rotation phase signals, the steering torque signals T, and the vehicle speed signals SV. The ECU 10 supplies an electric current to the motor 30 based on the calculated auxiliary steering command value.

The reduction gear 175 includes a worm shaft 175A and a worm wheel 175B. The worm shaft 175A integrally rotates with the shaft 31 of the motor 30. The worm wheel 175B meshes with the worm shaft 175A. Therefore, rotational motion of the shaft 31 is transmitted to the worm wheel 175B via the worm shaft 175A. In the present embodiment, the end of the shaft 31 facing the reduction gear 175 is referred to as a load-side end, and the end of the shaft 31 opposite to the reduction gear 175 is referred to as an anti-load-side end.

The second rack-and-pinion mechanism 170 includes a second pinion shaft 171A, a second pinion gear 171B, and a second rack 171C. The second pinion shaft 171A is fixed such that one end thereof rotates coaxially and integrally with the worm wheel 175B. The second pinion shaft 171A is connected to the second pinion gear 171B at the other end. The second rack 171C formed on the rack shaft 199C meshes with the second pinion gear 171B. Rotational motion of the motor 30 is transmitted to the second rack-and-pinion mechanism 170 via the reduction gear 175. The rotational motion is converted into linear motion of the rack shaft 199C by the second rack-and-pinion mechanism 170.

The driver's steering force input to the steering wheel 191 is transmitted to the first rack-and-pinion mechanism 199 via the steering shaft 192 and the intermediate shaft 197. The first rack-and-pinion mechanism 199 transmits the transmitted steering force to the rack shaft 199C as force applied in the axial direction of the rack shaft 199C. At this time, the ECU 10 acquires the steering torque signals T input to the steering shaft 192 from the torque sensor 194. The ECU 10 acquires the vehicle speed signals SV from the vehicle speed sensor 182. The ECU 10 acquires the rotation phase signals of the motor 30 from the rotation angle sensor 23a. The ECU 10 outputs control signals to control the operations of the motor 30. The auxiliary steering torque generated by the motor 30 is transmitted to the second rack-and-pinion mechanism 170 via the reduction gear 175. The second rack-and-pinion mechanism 170 transmits the auxiliary steering torque to the rack shaft 199C as force applied in the axial direction of the rack shaft 199C. Thus, the driver's steering on the steering wheel 191 is assisted by the electric power steering device 100.

While the electric power steering device 100 is a dual pinion system that applies the assist force to the second rack-and-pinion mechanism 170 as illustrated in FIG. 2, it is not limited thereto. The electric power steering device 100 may be a single-pinion assist system that applies the assist force only to the first pinion gear 199B. The electric power steering device 100 may be a rack parallel system including a pulley mechanism and a ball screw mechanism. The electric power steering device 100 is not limited thereto and may be a column assist system that applies the assist force to the steering shaft 192, for example.

Figure 3:
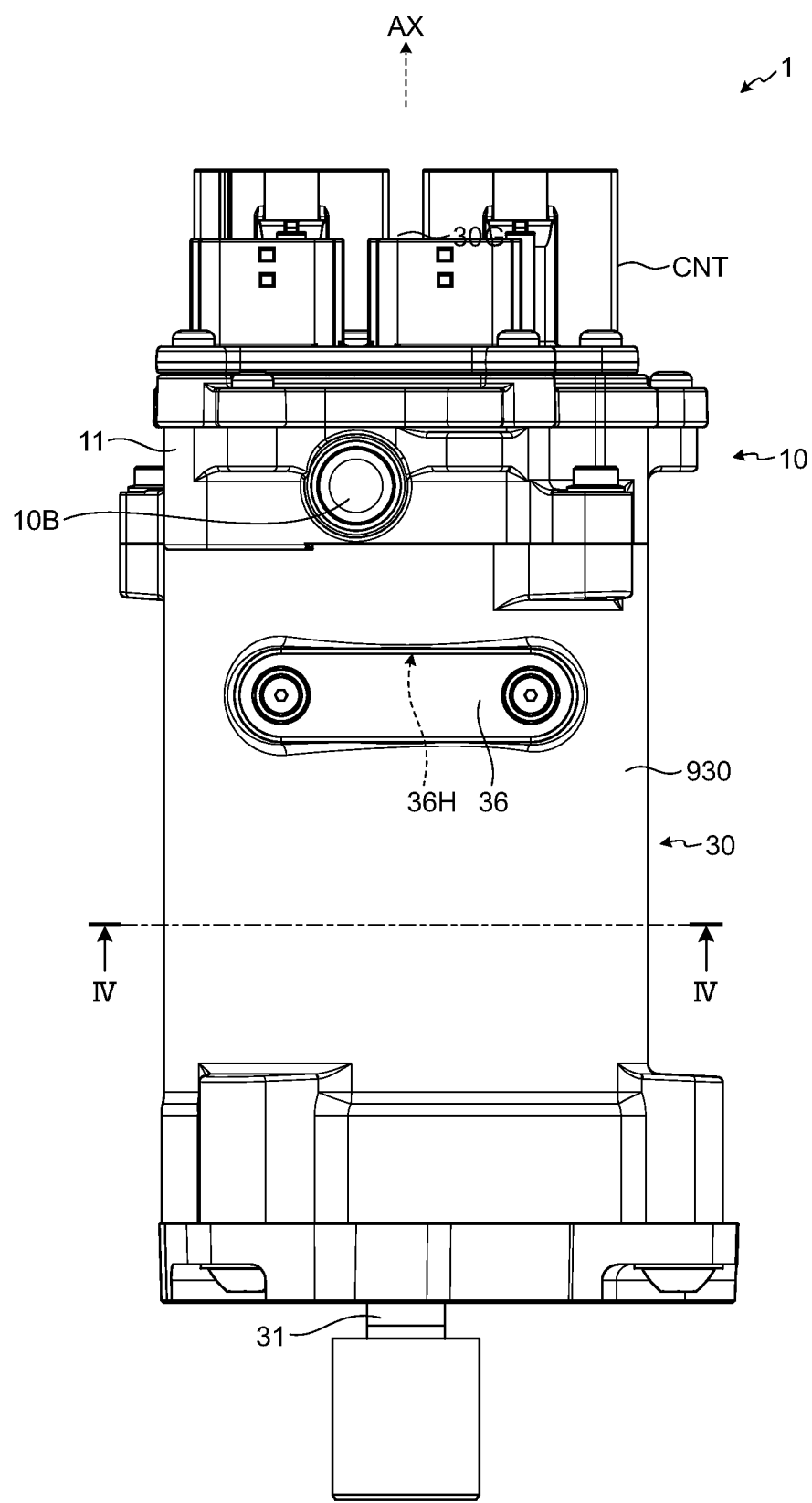
FIG. 3 is a side view of an arrangement example of an ECU according to the embodiment.

FIG. 3 is a side view of an arrangement example of the ECU according to the embodiment. As illustrated in FIG. 3, the electric driving device 1 includes the ECU 10 and the motor 30. The load-side end of the shaft 31 of the motor 30 is provided with a gear 30G, and the gear 30G is inserted into the reduction gear 175. A wire harness can be inserted into and removed from a connector CNT illustrated in FIG. 3 parallel to the direction in which the rack shaft 199C illustrated in FIG. 2 extends. An axial direction Ax according to the present embodiment refers to a direction parallel to the direction in which the shaft 31 (refer to FIG. 4) of the motor 30 extends.

The motor 30 includes a first housing 930. The first housing 930 has a tubular shape. The first housing 930 is also referred to as a motor housing. The first housing 930 has a tool insertion hole 36H and includes a side cover 36 that covers the tool insertion hole 36H and is detachable from the first housing 930. When the side cover 36 is removed from the first housing 930, a terminal block 80, which will be described later, is exposed through the tool insertion hole 36H.

A heat sink serving as the housing of the ECU 10 is provided with a waterproof ventilation filter 10B. The waterproof ventilation filter 10B allows air to pass therethrough but is waterproof and can prevent water from entering. If the pressure difference between the inside and the outside of the ECU 10 increases due to a temperature change, for example, air moves through the waterproof ventilation filter 10B to reduce the pressure difference.

Figure 4:
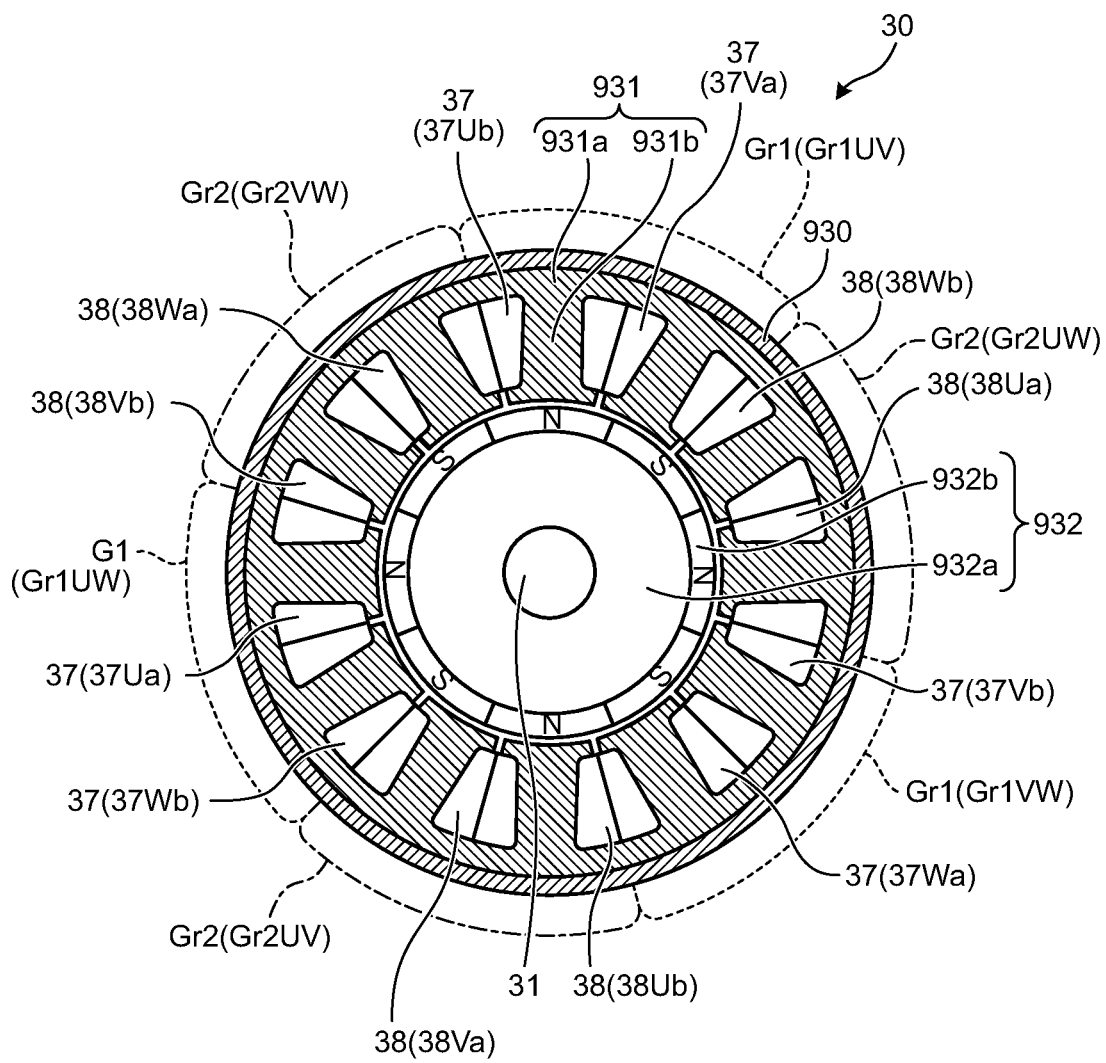
FIG. 4 is a sectional view schematically illustrating a section of a motor according to the embodiment.
Figure 5:
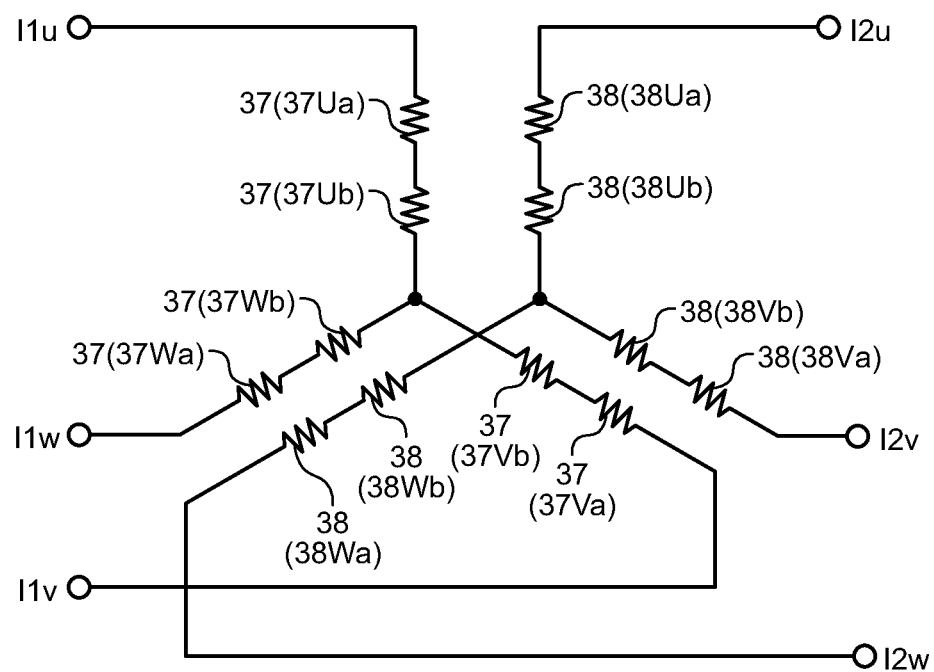
FIG. 5 is a schematic of wiring of the motor according to the embodiment.

FIG. 4 is a sectional view schematically illustrating a section of the motor according to the embodiment. FIG. 5 is a schematic of wiring of the motor according to the embodiment. The circumferential direction according to the present embodiment is a direction along a concentric circle about the shaft 31. The radial direction is a direction away from the shaft 31 in a plane orthogonal to the axial direction Ax. As illustrated in FIG. 4, the motor 30 includes the first housing 930, a motor stator 931, and a motor rotor 932. The motor stator 931 having a cylindrical shape includes a plurality of first motor coils 37 and a plurality of second motor coils 38. The motor stator 931 includes an annular back yoke 931a and a plurality of teeth 931b protruding from the inner periphery surface of the back yoke 931a. Twelve teeth 931b are disposed in the circumferential direction. The motor rotor 932 includes a rotor yoke 932a and magnets 932b. The magnets 932b are provided on the outer peripheral surface of the rotor yoke 932a. The number of magnets 932b is eight, for example. Rotation of the motor rotor 932 synchronizes with rotation of the shaft 31.

As illustrated in FIG. 4, the first motor coils 37 are concentrically wound around the respective teeth 931b. The first motor coils 37 are each concentrically wound around the outer periphery of the tooth 931b with an insulator interposed therebetween. All the first motor coils 37 are included in a first coil system. The first coil system according to the embodiment is supplied with an electric current and excited by an inverter circuit 251 (refer to FIG. 6) included in a first power circuit 25A. The first coil system includes six first motor coils 37, for example. The six first motor coils 37 are disposed such that each two first motor coils 37 are adjacently disposed in the circumferential direction. Three first coil groups Gr1 each composed of the adjacent first motor coils 37 serving as one group are disposed at equal intervals in the circumferential direction. In other words, the first coil system includes three first coil groups Gr1 disposed at equal intervals in the circumferential direction. The number of first coil groups Gr1 is not necessarily three. When n is a natural number, 3n first coil groups Gr1 simply need to be disposed at equal intervals in the circumferential direction. In addition, n is preferably an odd number. As described above, the present embodiment includes a plurality of coil groups. The coil groups are divided into at least two systems of the first coil group gr1 and a second coil group Gr2 for each of three phases, and the stator core is excited by three-phase alternating current.

As illustrated in FIG. 4, the second motor coils 38 are concentrically wound around the respective teeth 931b. The second motor coils 38 are each concentrically wound around the outer periphery of the tooth 931b with an insulator interposed therebetween. The tooth 931b around which the second motor coil 38 is concentrically wound is different from the tooth 931b around which the first motor coil 37 is concentrically wound. All the second motor coils 38 are included in a second coil system. The second coil system is supplied with an electric current and excited by the inverter circuit 251 (refer to FIG. 6) included in a second power circuit 25B. The second coil system includes six second motor coils 38, for example. The six second motor coils 38 are disposed such that each two second motor coils 38 are adjacently disposed in the circumferential direction. Three second coil groups Gr2 each composed of the adjacent second motor coils 38 serving as one group are disposed at equal internals in the circumferential direction. In other words, the second coil system includes three second coil groups Gr2 disposed at equal intervals in the circumferential direction. The number of second coil groups Gr2 is not necessarily three. When n is a natural number, 3n second coil groups simply need to be disposed at equal intervals in the circumferential direction. In addition, n is preferably an odd number.

As illustrated in FIG. 5, the six first motor coils 37 include two first U-phase motor coils 37Ua and 37Ub excited by a first U-phase current I1$u$, two first V-phase motor coils 37Va and 37Vb excited by a first V-phase current I1$v$, and two first W-phase motor coils 37Wa and 37Wb excited by a first W-phase current I1$w$. The first U-phase motor coil 37Ub is connected in series to the first U-phase motor coil 37Ua. The first V-phase motor coil 37Vb is connected in series to the first V-phase motor coil 37Va. The first W-phase motor coil 37Wb is connected in series to the first W-phase motor coil 37Wa. All the winding directions of the first motor coils 37 around the respective teeth 931b are the same direction. The first U-phase motor coil 37Ub, the first V-phase motor coil 37Vb, and the first W-phase motor coil 37Wb are connected by star connection (Y connection).

As illustrated in FIG. 5, the six second motor coils 38 include two second U-phase motor coils 38Ua and 38Ub excited by a second U-phase current I2$u$, two second V-phase motor coils 38Va and 38Vb excited by a second V-phase current I2v, and two second W-phase motor coils 38Wa and 38Wb excited by a second W-phase current I2w. The second U-phase motor coil 38Ub is connected in series to the second U-phase motor coil 38Ua. The second V-phase motor coil 38Vb is connected in series to the second V-phase motor coil 38Va. The second W-phase motor coil 38Wb is connected in series to the second W-phase motor coil 38Wa. All the winding directions of the second motor coils 38 around the respective teeth 931b are the same direction and are the same as the winding direction of the first motor coils 37. The second U-phase motor coil 38Ub, the second V-phase motor coil 38Vb, and the second W-phase motor coil 38Wb are connected by star connection (Y connection).

As illustrated in FIG. 4, the three first coil groups Gr1 are composed of a first UV coil group Gr1UV, a first VW coil group Gr1VW, and a first UW coil group Gr1UW. The first UV coil group Gr1UV includes the first U-phase motor coil 37Ub and the first V-phase motor coil 37Va adjacently disposed in the circumferential direction. The first VW coil group Gr1VW includes the first V-phase motor coil 37Vb and the first W-phase motor coil 37Wa adjacently disposed in the circumferential direction. The first UW coil group Gr1UW includes the first U-phase motor coil 37Ua and the first W-phase motor coil 37Wb adjacently disposed in the circumferential direction.

As illustrated in FIG. 4, the three second coil groups Gr2 are composed of a second UV coil group Gr2UV, a second VW coil group Gr2VW, and a second UW coil group Gr2UW. The second UV coil group Gr2UV includes the second U-phase motor coil 38Ub and the second V-phase motor coil 38Va adjacently disposed in the circumferential direction. The second VW coil group Gr2VW includes the second V-phase motor coil 38Vb and the second W-phase motor coil 38Wa adjacently disposed in the circumferential direction. The second UW coil group Gr2UW includes the second U-phase motor coil 38Ua and the second W-phase motor coil 38Wb adjacently disposed in the circumferential direction.

The first motor coils 37 excited by the first U-phase current I1u face the second motor coils 38 excited by the second U-phase current I2u in the radial direction of the motor stator 931. In the following description, the radial direction of the motor stator 931 is simply referred to as the radial direction. As illustrated in FIG. 4, for example, the first U-phase motor coil 37Ua faces the second U-phase motor coil 38Ua in the radial direction, and the first U-phase motor coil 37Ub faces the second U-phase motor coil 38Ub.

The first motor coils 37 excited by the first V-phase current I1v face the second motor coils 38 excited by the second V-phase current I2v in the radial direction. As illustrated in FIG. 4, for example, the first V-phase motor coil 37Va faces the second V-phase motor coil 38Va in the radial direction, and the first V-phase motor coil 37Vb faces the second V-phase motor coil 38Vb.

The first motor coil 37 excited by the first W-phase current I1w faces the second motor coil 38 excited by the second W-phase current I2w in the radial direction. As illustrated in FIG. 4, for example, the first W-phase motor coil 37Wa faces the second W-phase motor coil 38Wa in the radial direction, and the first W-phase motor coil 37Wb faces the second W-phase motor coil 38Wb.

Figure 6:
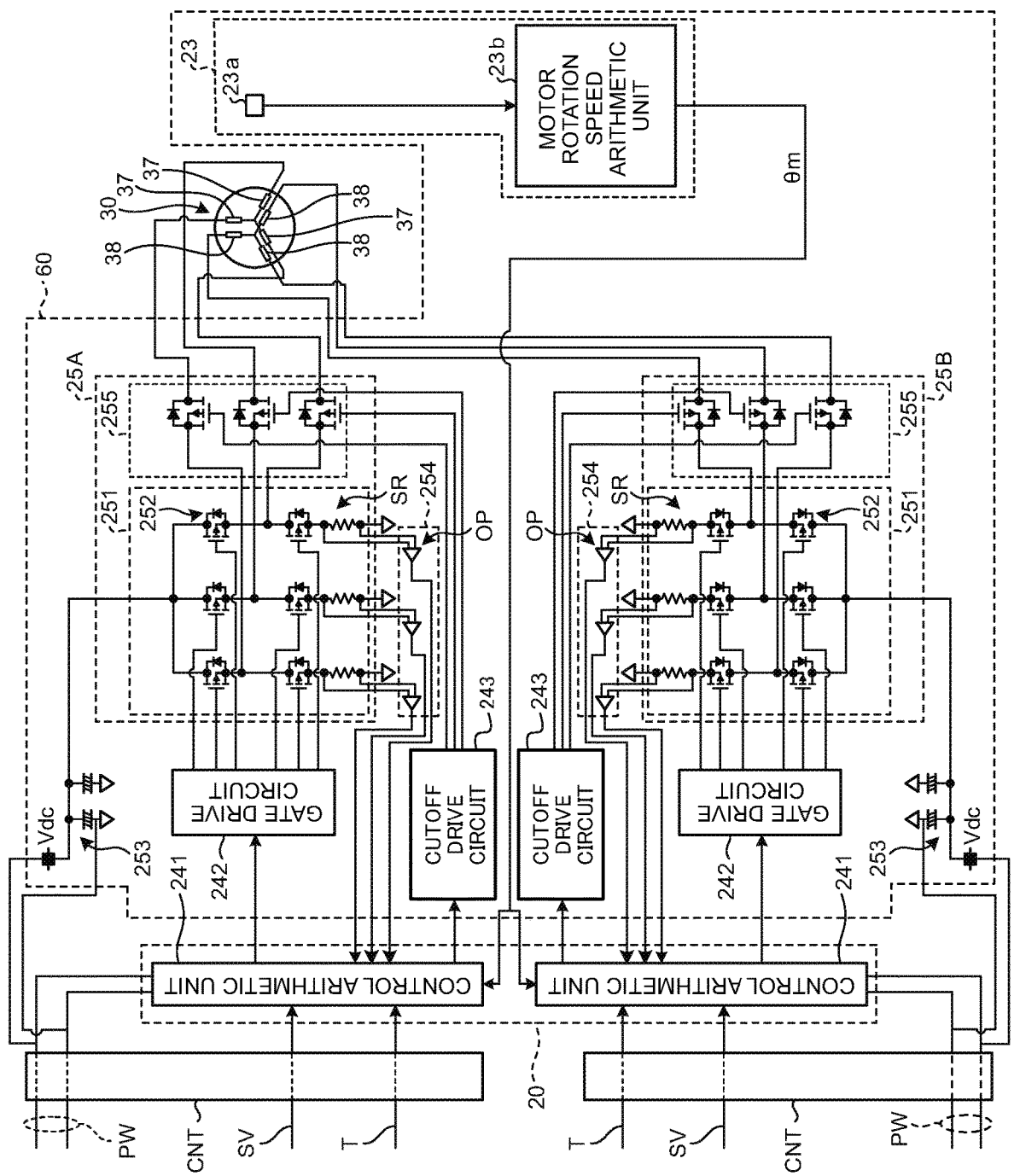
FIG. 6 is a diagram for explaining the relation between the motor and the ECU according to the embodiment.

FIG. 6 is a schematic of the relation between the motor and the ECU according to the embodiment. As illustrated in FIG. 6, the ECU 10 includes a detection circuit 23, a control circuit 24, the first power circuit 25A, and the second power circuit 25B. The detection circuit 23 includes the rotation angle sensor 23a and a motor rotation speed arithmetic unit 23b. The control circuit 24 includes a control arithmetic unit 241, a gate drive circuit 242, and a cutoff drive circuit 243. The first power circuit 25A includes the inverter circuit 251 and a current cutoff circuit 255. The second power circuit 25B includes the inverter circuit 251 and a current cutoff circuit 255. The inverter circuit 251 includes a plurality of switching elements 252 and shunt resistors SR for detecting a current value. The shunt resistor SR is connected to an operational amplifier OP of a current detection circuit 254. FIG. 6 does not illustrate circuits that need not be explained as appropriate. Three shunt resistors SR are connected to the respective three switching elements 252. Only one shunt resistor SR may be provided, and the three switching elements 252 may be connected to the shunt resistor SR.

The control arithmetic unit 241 calculates the motor current command value. The motor rotation speed arithmetic unit 23b calculates a motor electric angle θm and outputs it to the control arithmetic unit 241. The gate drive circuit 242 receives the motor current command value output from the control arithmetic unit 241. The gate drive circuit 242 controls the first power circuit 25A and the second power circuit 25B based on the motor current command value. The gate drive circuit 242 includes a capacitor 256, which will be described later, in the power supply line.

As illustrated in FIG. 6, the ECU 10 includes the rotation angle sensor 23a. The rotation angle sensor 23a is a magnetic sensor, for example. The value detected by the rotation angle sensor 23a is supplied to the motor rotation speed arithmetic unit 23b. The motor rotation speed arithmetic unit 23b calculates the motor electric angle θm based on the detected value of the rotation angle sensor 23a and outputs it to the control arithmetic unit 241.

The control arithmetic unit 241 receives the steering torque signals T obtained by detection by the torque sensor 194, the vehicle speed signals SV obtained by detection by the vehicle speed sensor 182, and the motor electric angle θm output from the motor rotation speed arithmetic unit 23b. The control arithmetic unit 241 calculates the motor current command value based on the steering torque signals T, the vehicle speed signals SV, and the motor electric angle θm and outputs it to the gate drive circuit 242.

The gate drive circuit 242 calculates first pulse width modulation signals based on the motor current command value and outputs them to the inverter circuit 251 of the first power circuit 25A. The inverter circuit 251 switches the switching elements 252 so as to obtain three-phase current values based on the duty ratio of the first pulse width modulation signals, thereby generating three-phase alternating current including the first U-phase current I1u, the first V-phase current I1v, and the first W-phase current I1w. The first U-phase current I1u excites the first U-phase motor coil 37Ua and the first U-phase motor coil 37Ub, the first V-phase current I1v excites the first V-phase motor coil 37Va and the first V-phase motor coil 37Vb, and the first W-phase current I1w excites the first W-phase motor coil 37Wa and the first W-phase motor coil 37Wb.

The gate drive circuit 242 calculates second pulse width modulation signals based on the motor current command value and outputs them to the inverter circuit 251 of the second power circuit 25B. The inverter circuit 251 switches the switching elements 252 so as to obtain three-phase current values based on the duty ratio of the second pulse width modulation signals, thereby generating three-phase alternating current including the second U-phase current I2u, the second V-phase current I2v, and the second W-phase current I2w. The second U-Phase current I2u excites the second U-phase motor coil 38Ua and the second U-phase motor coil 38Ub, the second V-phase current I2v excites the second V-phase motor coil 38Va and the second V-phase motor coil 38Vb, and the second W-phase current I2w excites the second W-phase motor coil 38Wa and the second W-phase motor coil 38Wb.

The inverter circuit 251 is a power conversion circuit that converts direct-current power to alternating-current power. As described above, the inverter circuit 251 includes a plurality of switching elements 252. The switching element 252 is a field-effect transistor, for example. A capacitor 253 is connected in parallel to the inverter circuit 251. A first circuit board 60 includes a plurality of capacitors 253 connected in parallel.

As described above, the current detection circuit 254 is connected to the inverter circuit 251. The current detection circuit 254 is connected to the shunt resistors SR, for example. The current value detected by the current detection circuit 254 is output to the control arithmetic unit 241. The current detection circuit 254 may be connected so as to detect the current value of each phase of the motor 30.

The current cutoff circuit 255 is disposed between the inverter circuit 251 and the first motor coil 37 or the second motor coil 38. If the current value detected by the current detection circuit 254 is determined to be abnormal, the control arithmetic unit 241 can drive the current cutoff circuit 255 via the cutoff drive circuit 243 to cut off an electric current flowing from the inverter circuit 251 to the first motor coil 37. The control arithmetic unit 241 can also drive the current cutoff circuit 255 via the cutoff drive circuit 243 to cut off an electric current flowing from the inverter circuit 251 to the second motor coil 38. Thus, the electric current flowing to the first motor coil 37 and the electric current flowing to the second motor coil 38 are independently controlled by the control arithmetic unit 241. In addition, input/output signals, such as the steering torque signals T and the vehicle speed signals SV, are transmitted to the control arithmetic unit 241 via the connector CNT.

Figure 7:
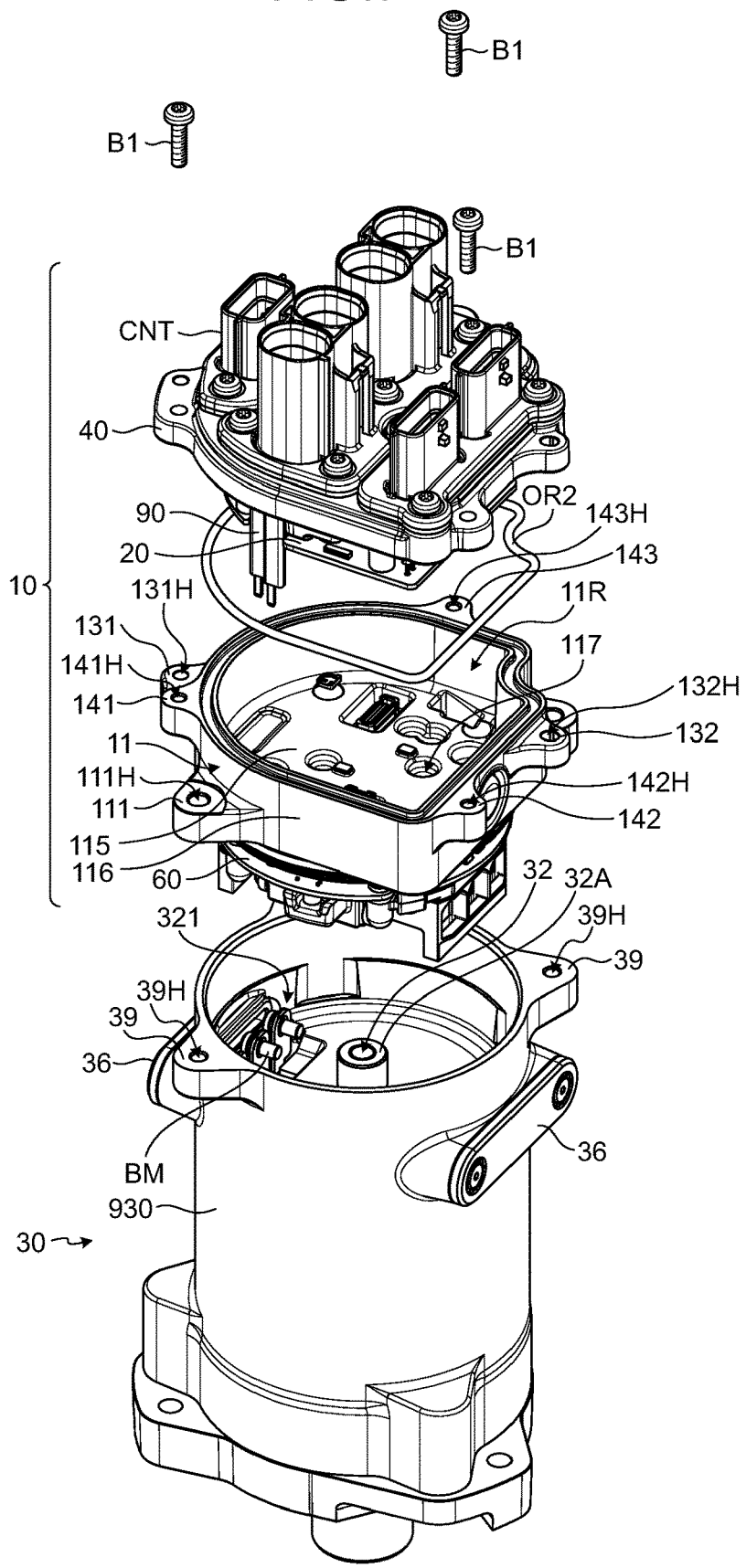
FIG. 7 is an exploded perspective view of a configuration example of an electric driving device according to the embodiment.
Figure 8:
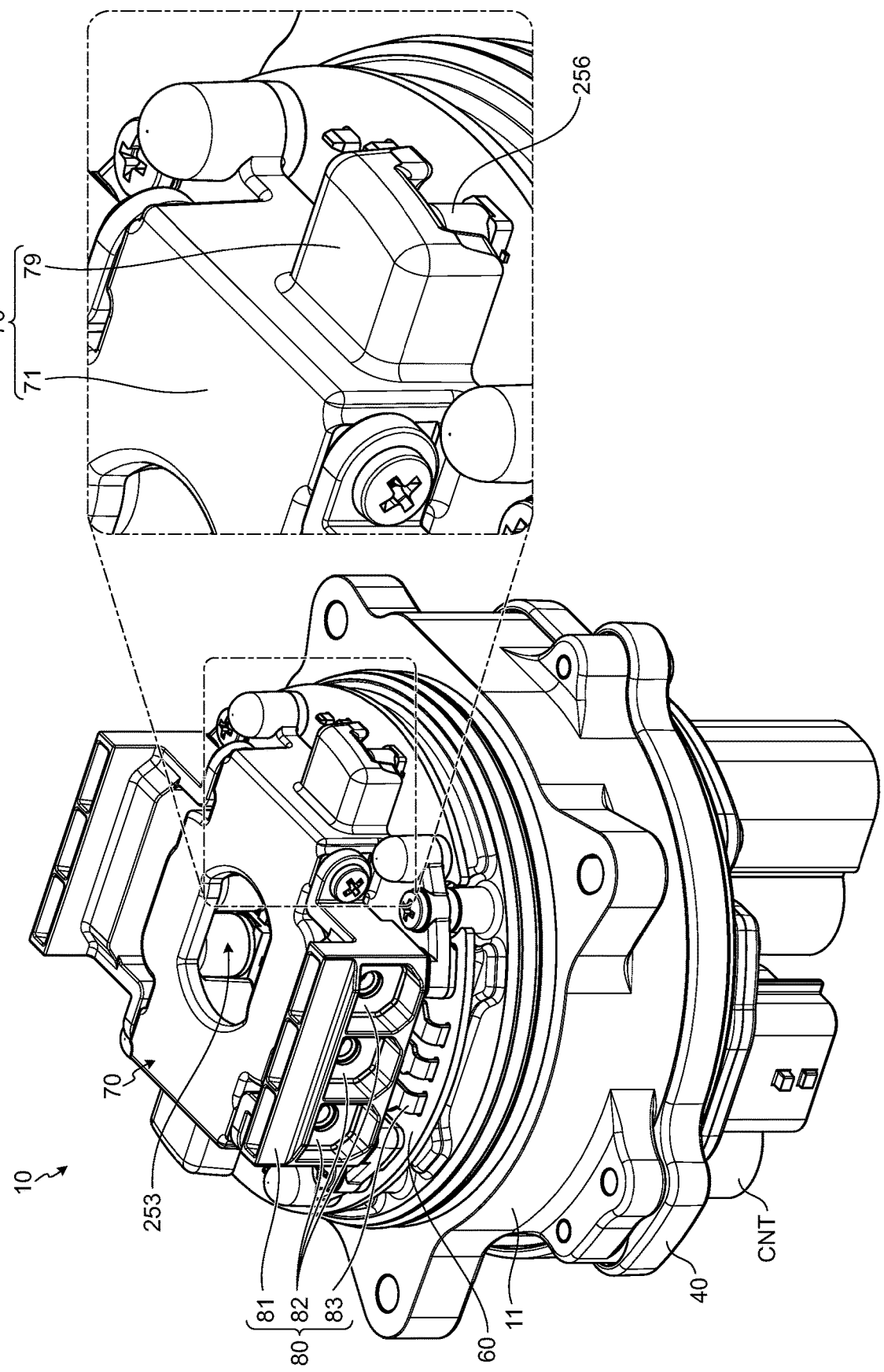
FIG. 8 is a perspective view of a configuration example of the ECU according to the embodiment.

FIG. 7 is an exploded perspective view of a configuration example of the electric driving device according to the embodiment. FIG. 8 is a perspective view of a configuration example of the ECU according to the embodiment. As illustrated in FIG. 7, the electric driving device 1 includes the motor 30 and the ECU 10 disposed on the anti-load side of the motor 30.

The anti-load-side end of the shaft 31 is provided with a magnet 32 with a magnet folder 32A. One half of the magnet 32 is magnetized to be the S-pole, and the other half to be the N-pole. Alternatively, the magnet 32 may have the S-poles and the N-poles alternately in the circumferential direction on the outer peripheral surface.

As illustrated in FIG. 7, the ECU 10 includes the first circuit board 60, a second circuit board 20, a second housing 11, a lid 40, a power supply wiring module 90, and a connector CNT. The second housing 11 is made of metal with high heat dissipation, such as aluminum and copper. The second housing 11 acts as a heat sink that dissipates heat generated by the first circuit board 60 and the second circuit board 20. The lid 40 is made of metal with high heat dissipation, such as aluminum and copper, and is joined to the second housing 11. With this configuration, the heat generated by the first circuit board 60 and the second circuit board 20 is efficiently dissipated from the lid 40 to the outside if the heat is transferred from the second housing 11.

The second housing 11 has a bottom 115 and a side wall 116 surrounding the bottom 115. An accommodation space 11R is formed inside the side wall 116. The lid 40 covers the accommodation space 11R of the second housing 11 with a sealing member 12 interposed therebetween, thereby sealing the accommodation space 11R of the second housing 11. A sealing member OR2 is what is called an O-ring made of rubber or elastomer. The anti-load side of the bottom 115 has a recess 117 that accommodates an electronic part.

One surface of the lid 40 on the load side is provided with the second circuit board 20 and the power supply wiring module 90, and the other surface of the lid 40 on the anti-load side is provided with the connector CNT. When the lid 40 is attached to the second housing 11, the second circuit board 20 and the power supply wiring module 90 are accommodated in the accommodation space 11R of the second housing 11. As a result, the size of the ECU 10 is reduced in the axial direction Ax.

The anti-load-side end of the first housing 930 of the motor 30 has flanges 39. Each flange 39 has a female thread 39H in the axial direction Ax. The load-side end of the second housing 11 has flanges 111. Each flange 111 has a through hole 111H in the axial direction Ax. Fixing members B1, such as screws, pass through the through holes 111H and are fastened to the female threads 39H, thereby fixing the first housing 930 to the second housing 11.

The anti-load-side end of the second housing 11 has a plurality of flanges 131, 132, 141, 142, and 143. The flange 131 has a through hole 131H in the axial direction Ax. The flange 132 has a through hole 132H in the axial direction Ax. The flange 141 has a female thread 141H in the axial direction Ax. The flange 142 has a female thread 142H in the axial direction Ax. The flange 142 has a female thread 142H in the axial direction Ax.

As illustrated in FIG. 8, the second housing 11 sandwiches the first circuit board 60 between it and a support 70. The support 70 is a heat sink with excellent heat dissipation made of metal with high heat dissipation, such as aluminum and copper. The side surfaces of the support 70 are provided with two terminal blocks 80.

Figure 9:
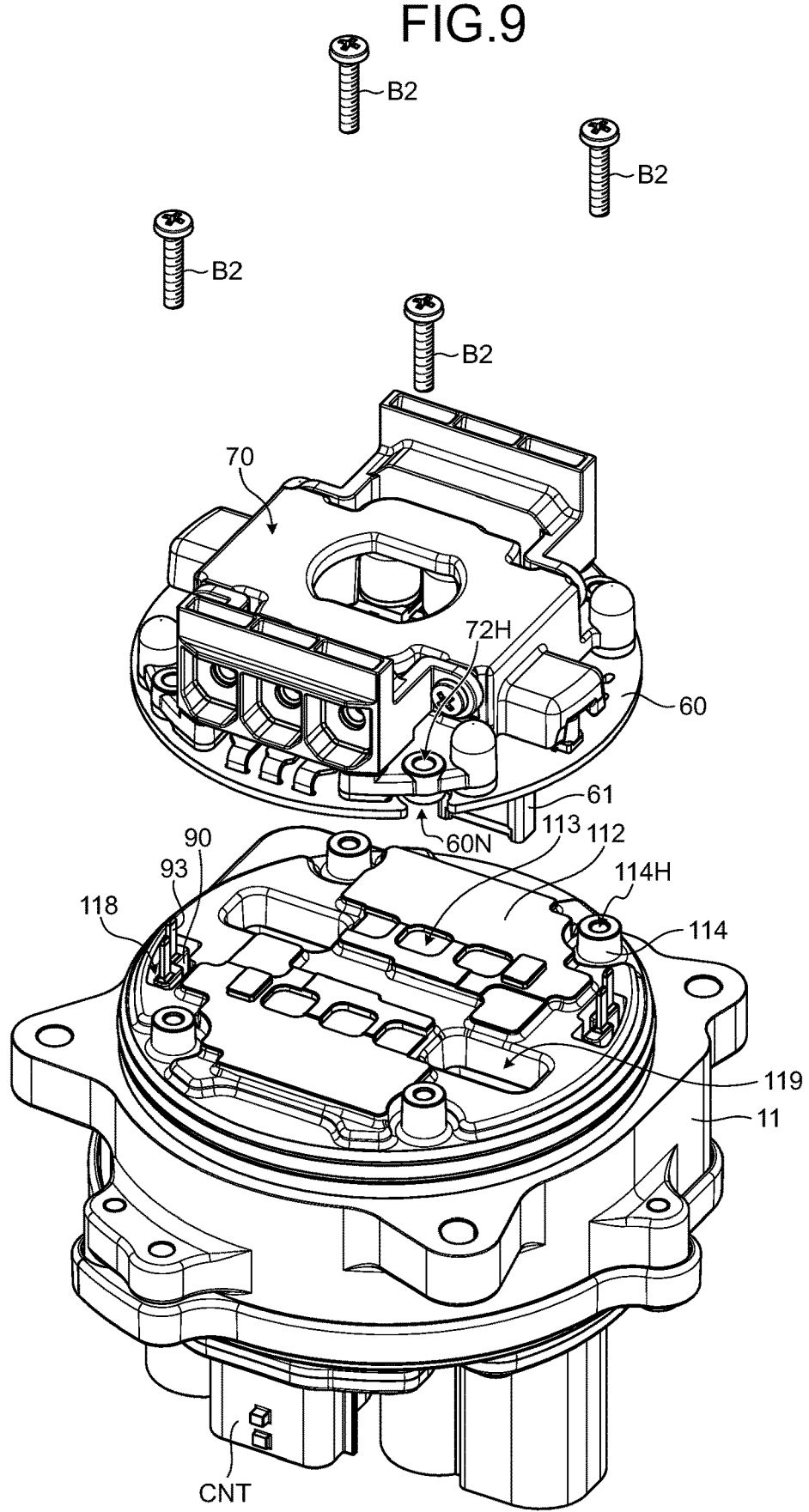
FIG. 9 is an exploded perspective view of a configuration example of the ECU according to the embodiment.
Figure 10A:
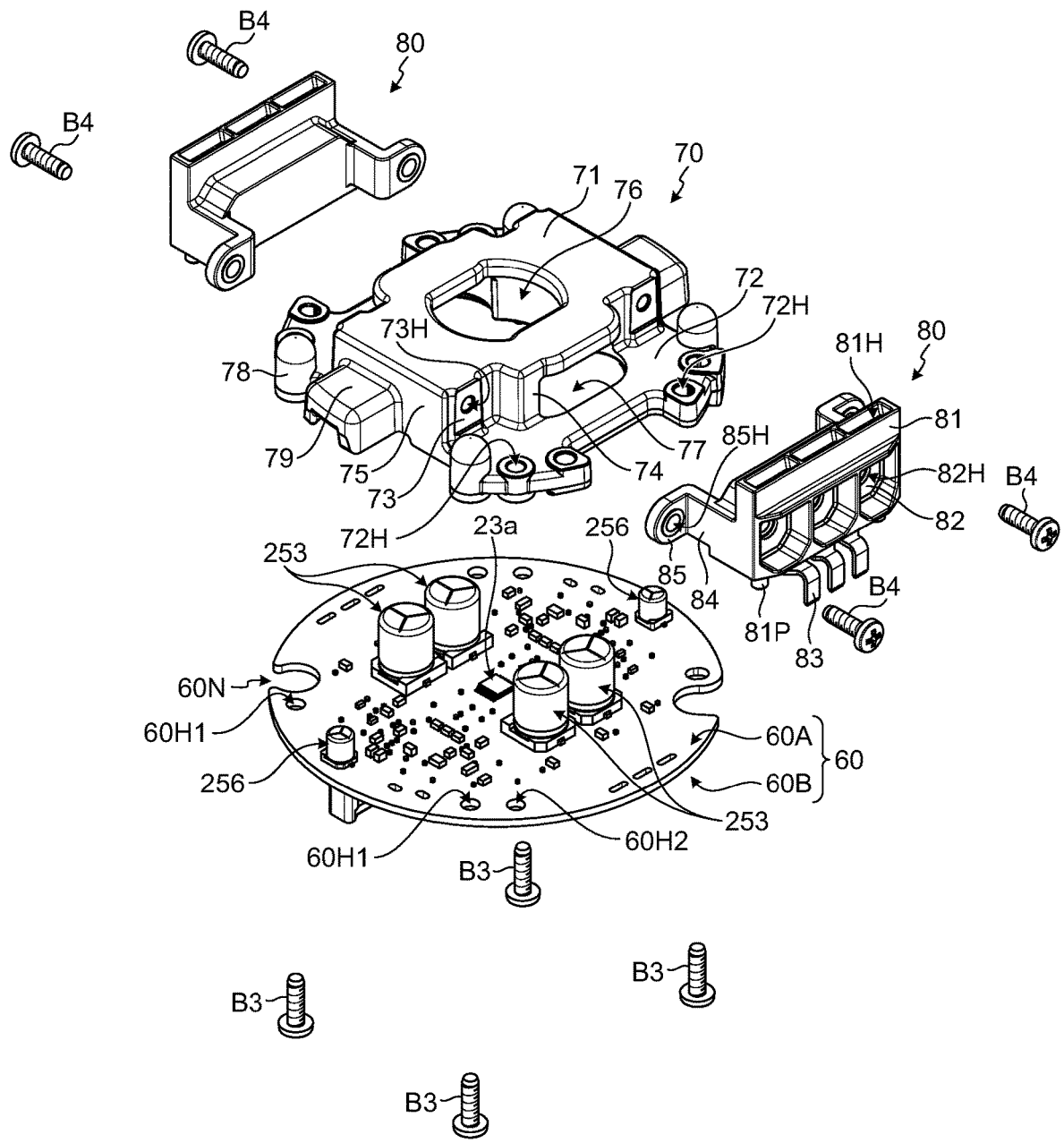
FIG. 10A is an exploded perspective view of a configuration example for attaching terminal blocks to a power circuit board according to the embodiment.

FIG. 9 is an exploded perspective view of a configuration example of the ECU according to the embodiment. FIG. 10A is an exploded perspective view of a configuration example for attaching the terminal blocks to a power circuit board according to the embodiment. As illustrated in FIGS. 9 and 10A, the terminal block 80 includes a base 81, mounting fittings 82, and conductive terminals 83. The base 81 is made of insulating material and secures insulation between terminals. One end of the conductive terminal 83 is inserted into and electrically connected to the first circuit board 60.

Figure 10B:
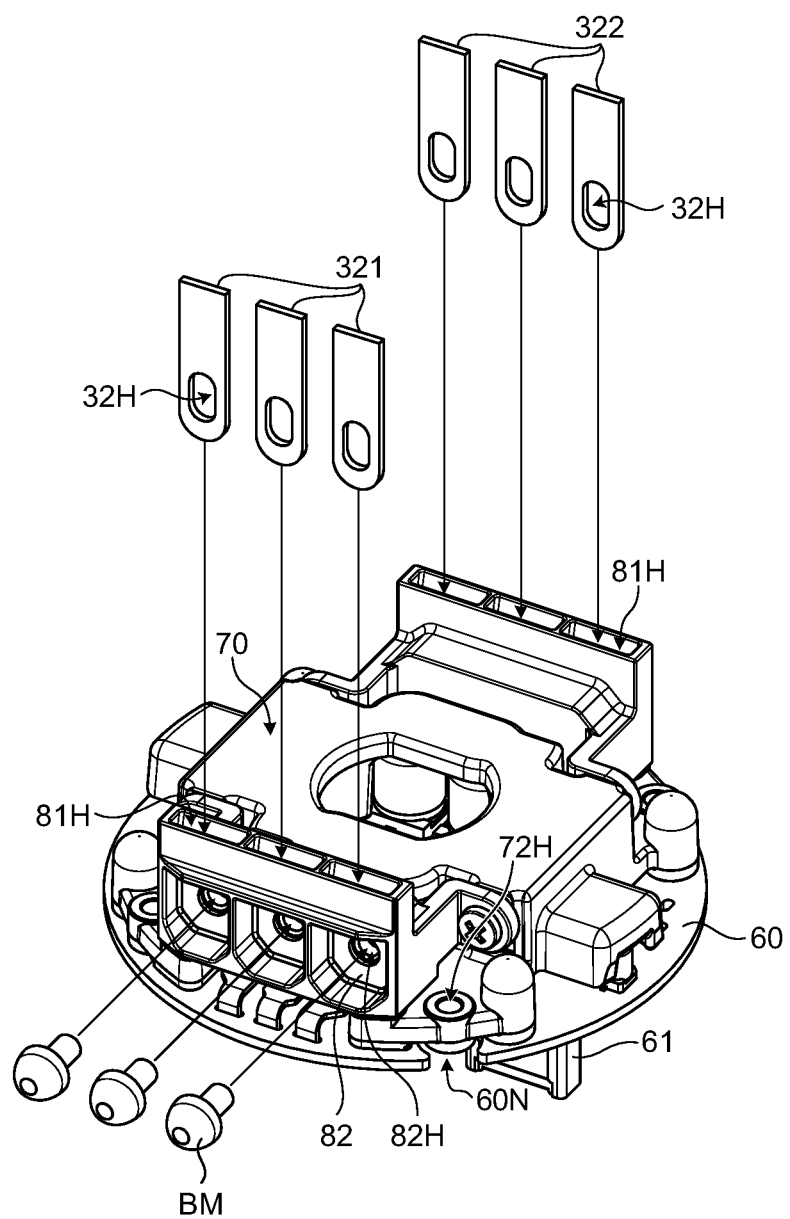
FIG. 10B is an exploded perspective view of a configuration example for attaching motor coil wiring to the terminal blocks according to the embodiment.

FIG. 10B is an exploded perspective view of a configuration example for attaching motor coil wiring to the terminal blocks according to the embodiment. The other end of the conductive terminal 83 is electrically connected to the mounting fitting 82. As illustrated in FIGS. 10A and 10B, the mounting fitting 82 has a through hole 82H through which a fixing member BM, such as a screw illustrated in FIGS. 7 and 10B, passes. First motor coil wiring 321 or second motor coil wiring 322 of the motor 30 has a through hole 32H. The first motor coil wiring 321 or the second motor coil wiring 322 is inserted into an insertion hole 81H of the base 81. The fixing member BM passes through the position at which the through hole 82H and the through hole 32H communicate with each other and is fastened to a nut (not illustrated) on the back surface of the first motor coil wiring 321 or the second motor coil wiring 322. As a result, one terminal block 80 electrically connects the first circuit board 60 to the first motor coil wiring 321 of the motor 30, and the other terminal block 80 electrically connects the first circuit board 60 to the second motor coil wiring 322 of the motor 30. The mounting fitting 82 may be closely fixed to the conductive terminal 83 or may be integrated with the conductive terminal 83 to form a single part.

The support 70 has a first top plate 71 and a second top plate 79 with different heights. The first top plate 71 and the second top plate 79 have different sizes depending on the height of capacitors 253 and 256 provided between them and the first circuit board 60. A heat dissipation material is interposed between the capacitors 253 and 256 and the first top plate 71 and the second top plate 79. With this configuration, heat of the capacitors 253 and 256 is transferred to the first top plate 71 and the second top plate 79, thereby suppressing deterioration of the capacitors 253 and 256. The capacitors 253 and 256 are electrolytic capacitors, for example.

As illustrated in FIG. 9, the second housing 11 has a flat heat dissipation surface 112, recesses 113, and protrusions 114 on the load side. The second housing 11 has first through holes 119 and second through holes 118 passing therethrough in the axial direction Ax. Part of the power supply wiring module 90 is inserted into the second through hole 118, and a first power supply terminal 93 reaches the first circuit board 60. A plug 62 of an inter-board connector is inserted into the first through hole 119 and reaches a receptacle 61 (refer to FIG. 12) of the second circuit board 20. The inter-board connector transmits signals between the first circuit board 60 and the second circuit board 20. The inter-board connector including the plug 62 and the receptacle 61 is called a floating connector. The inter-board connector has a movable part and can absorb misalignment when the plug 62 and the receptacle 61 are mated together.

Each protrusion 114 has a female thread 114H opened from the upper surface on the load side in the axial direction Ax. Some of the protrusions 114 face the support 70 in cutouts 60N of the first circuit board 60. The other protrusions 114 face through holes 60H2 of the first circuit board 60 illustrated in FIG. 10A. The support 70 has through holes 72H passing therethrough in the axial direction Ax. Fixing members B2, such as screws, pass through the through holes 72H and the cutouts 60N or the through holes 60H2 of the first circuit board 60 and are fastened to the female threads 114H.

As illustrated in FIG. 10A, the support 70 has a base 72 and the first top plate 71 protruding from the base 72 toward the load side. The support 70 has two first side surfaces 74 and two second side surfaces 75. The first side surfaces 74 and the second side surfaces 75 connect the base 72 and the first top plate 71. The support 70 has two second top plates 79 extending in a second direction away from the respective two second side surfaces 75.

The first top plate 71 of the support 70 has a through hole 76 passing therethrough in the axial direction Ax. The magnet 32 (refer to FIG. 7) provided at the anti-load-side end of the shaft 31 is inserted into the through hole 76. As a result, the magnet 32 is disposed near the rotation angle sensor 23a mounted on the first circuit board 60. The side surfaces of the support 70 also have through holes 77. When the terminal blocks 80 are attached to the support 70, the through holes 77 are covered. The weight of the support 70 is reduced by the size of the through holes 77.

Figure 11:
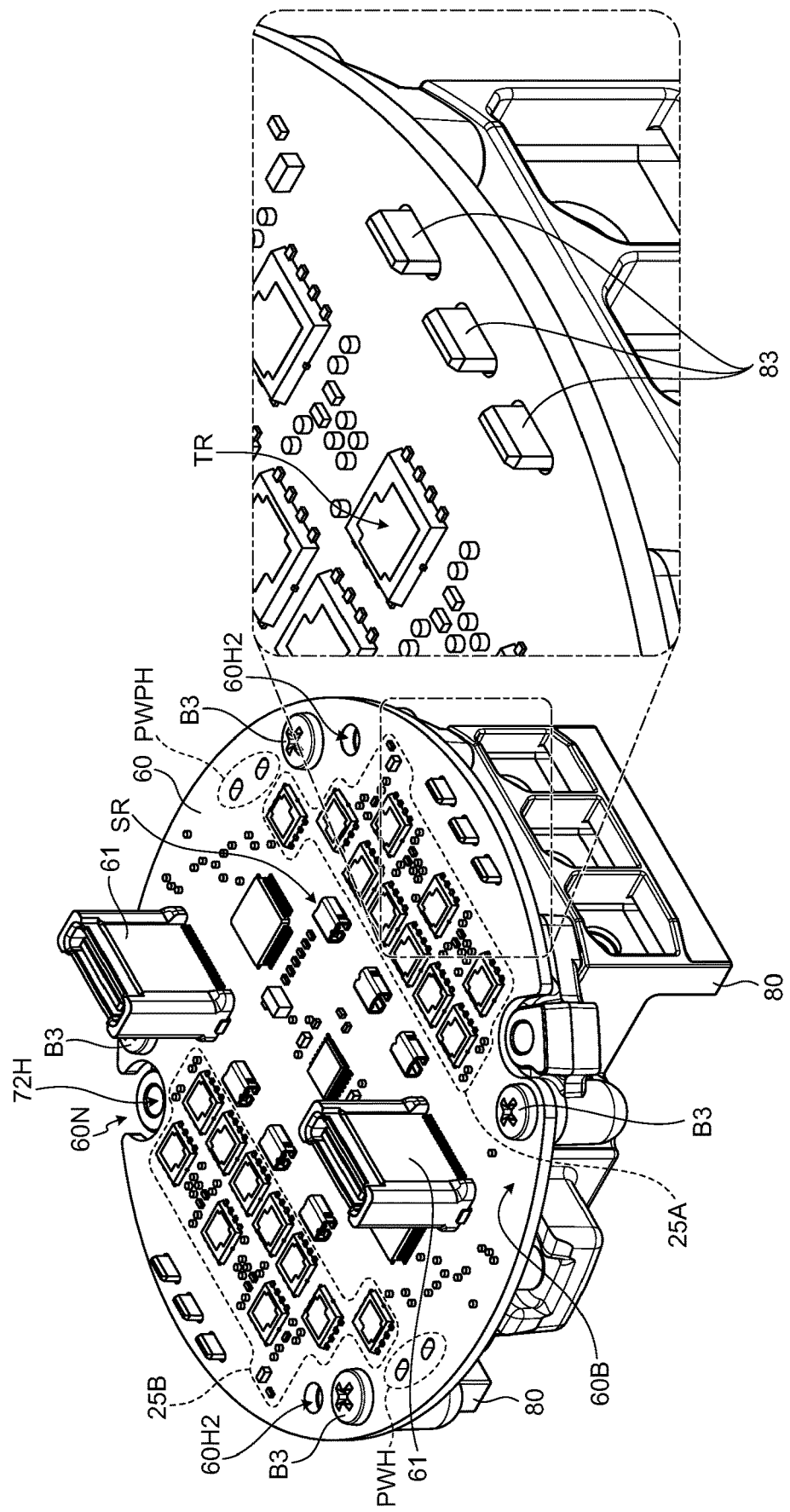
FIG. 11 is a perspective view of a configuration example for attaching the terminal blocks to the power circuit board according to the embodiment.

FIG. 11 is a perspective view of a configuration example for attaching the terminal blocks to the power circuit board according to the embodiment. The support 70 illustrated in FIG. 11 has four female threads 78 opening on the anti-load side. When fixing members B3, such as screws, pass through through holes 60H1 of the first circuit board 60 and are fastened to the female threads 78, the support 70 and the first circuit board 60 are closely fixed as illustrated in FIG. 11. The female threads 78 diagonally positioned and opening on the anti-load side are preferably formed in point symmetry. This configuration facilitates assembling the support 70 and the first circuit board 60.

As illustrated in FIGS. 10A and 11, the first circuit board 60 includes a plurality of electronic parts mounted on both surfaces of the board body. The board body of the first circuit board 60 is a printed circuit board made of resin, for example. The electronic parts mounted on one board body include field-effect transistors (FETs), magnetic sensors, electrolytic capacitors, resistor elements, diodes, thermistors, application-specific integrated circuits (ASICs), and other components. These electronic parts constitute the detection circuit 23, the first power circuit 25A, and the second power circuit 25B illustrated in FIG. 6.

As illustrated in FIG. 10A, the capacitors 253 and 256 are mounted on a first surface 60A of the first circuit board 60. When the support 70 is attached to the first circuit board 60, the capacitors 253 and 256 are covered by the support 70 as illustrated in FIG. 9.

As illustrated in FIG. 10A, the rotation angle sensor 23a is mounted on the first surface 60A of the first circuit board 60. The rotation angle sensor 23a is a spin valve sensor, for example. A spin valve sensor is a sensor that can detect changes in the direction of a magnetic flux with an element obtained by sandwiching a nonmagnetic layer between a ferromagnetic pin layer in which the direction of magnetization is fixed by an antiferromagnetic layer or the like and a ferromagnetic free layer. Examples of the spin valve sensor include, but are not limited to, a GMR (giant magneto resistance) sensor, a TMR (tunnel magneto resistance) sensor, etc. The rotation angle sensor 23a simply needs to be a sensor capable of detecting the rotation of the magnet 32. The rotation angle sensor 23a may be an AMR (anisotropic magneto resistance) sensor or a Hall sensor, for example.

As illustrated in FIG. 10A, a second surface 60B of the first circuit board 60 is provided with field-effect transistors TR and shunt resistors SR serving as electronic parts that generate heat. The field-effect transistors TR are provided not only to the switching elements 252 illustrated in FIG. 6 but also to the current cutoff circuit 255, the cutoff drive circuit 243, and wiring that supplies power supply voltage Vdc. As illustrated in FIG. 6, the shunt resistors SR are connected to the current detection circuit 254.

The field-effect transistors TR are in contact with the heat dissipation surface 112 of the second housing 11 illustrated in FIG. 9 with a heat dissipation material called TIM (thermal interface material) interposed therebetween. The heat dissipation material is material obtained by mixing thermally conductive filler with silicone polymer, for example, and may be material other than that described above as long as it has thermal conductivity higher than that of the board body of the first circuit board 60. The shunt resistors SR are disposed in the recesses 113 of the second housing 11 illustrated in FIG. 9. Heat dissipation materials are provided in the recesses 113.

As illustrated in FIG. 10A, legs 84 extend toward the support 70 from both sides of the base 81 of the terminal block 80, and ends 85 of the legs 84 each have a through hole 85H. Fixing members B4, such as screws, pass through the through holes 85H and are fastened to female threads 73H on contact surfaces 73 of the first side surface 74.

The contact surface 73 of the first side surface 74 illustrated in FIG. 10A is parallel to the contact surface of the fixing member BM of the mounting fitting 82 illustrated in FIG. 10B. If the terminal block 80 is pressed by the fixing member BM, such as a screw, the stress due to the pressing is received by the contact surfaces 73 of the first side surface 74 via the ends 85 of the legs 84. As a result, deformation of the conductive terminals 83 is suppressed, and the stress applied to the first circuit board 60 is reduced.

As described above, the ECU 10 includes the first circuit board 60, the second housing 11, the support 70 serving as a heat sink, and the terminal blocks 80. The first circuit board 60 is provided with the field-effect transistors TR and a rotation angle sensor 31*a*. The field-effect transistors TR output an electric current to excite the first motor coil 37 or the second motor coil 38. The rotation angle sensor 31*a* is disposed on an extension of the axial direction Ax of the shaft 31. The second housing 11 is provided on the anti-load side of the first circuit board 60. The support 70 is provided on the load side of the first circuit board 60 and sandwiches the first circuit board 60 between it and the second housing 11. The terminal block 80 is fixed to the contact surface 73 of the first side surface 74 of the support 70 serving as a heat sink and electrically connects the first motor coil wiring 321 or the second motor coil wiring 322 to the first circuit board 60.

As a result, the first circuit board 60 is sandwiched between the second housing 11 and the support 70 serving as a heat sink in the axial direction Ax. This configuration reduces the size of the motor 30 in the axial direction Ax parallel to the shaft 31 and makes the electric driving device 1 smaller. The terminal block 80 is fixed to and supported by the contact surfaces 73 of the first side surface 74 of the support 70. If the terminal block 80 is pressed by the fixing member BM, such as a screw, the stress due to the pressing is applied to the support 70, and the stress applied to the first circuit board 60 is reduced. As a result, the life of the first circuit board 60 is extended, and the reliability of the electric driving device 1 is improved.

The first housing 930 has the tool insertion hole 36H. The motor 30 includes the side cover 36 that covers the tool insertion hole 36H and is detachable from the first housing 930. Detaching the side cover 36 facilitates electrically connecting or disconnecting the motor 30 and the ECU 10.

In the first circuit board 60, the field-effect transistors TR are mounted on the second surface 60B facing the second housing 11, and the capacitors 253 and 256 serving as electrolytic capacitors are mounted on the first surface 60A facing the support 70. With this configuration, both surfaces of the first circuit board 60 are effectively used, and the first circuit board 60 can be downsized in the radial direction.

The support 70 has the first top plate 71 covering the capacitors 253. The magnet 32 is inserted into the through hole 76 in the axial direction formed in the top plate at a position not overlapping the capacitors 253. With this configuration, cooling of the capacitors 253 is provided by heat conduction to the first top plate 71. The first side surface 74 of the support 70 formed corresponding to the size of the capacitors 253 in the axial direction Ax can be used as the contact surfaces 73 in contact with the terminal block 80. The space outside the magnet 32 in the radial direction can also be used as an arrangement region for the capacitors 253 by inserting the magnet 32 at the position not overlapping the capacitors 253. As a result, the size of the electric driving device 1 is reduced in the axial direction Ax.

A step is formed between the first top plate 71 and the second top plate 79. With this configuration, the support 70 serves as a heat sink with the minimum volume corresponding to the size of the capacitors 253 and 256, thereby contributing to reduction in weight of the electric driving device 1.

Figure 12:
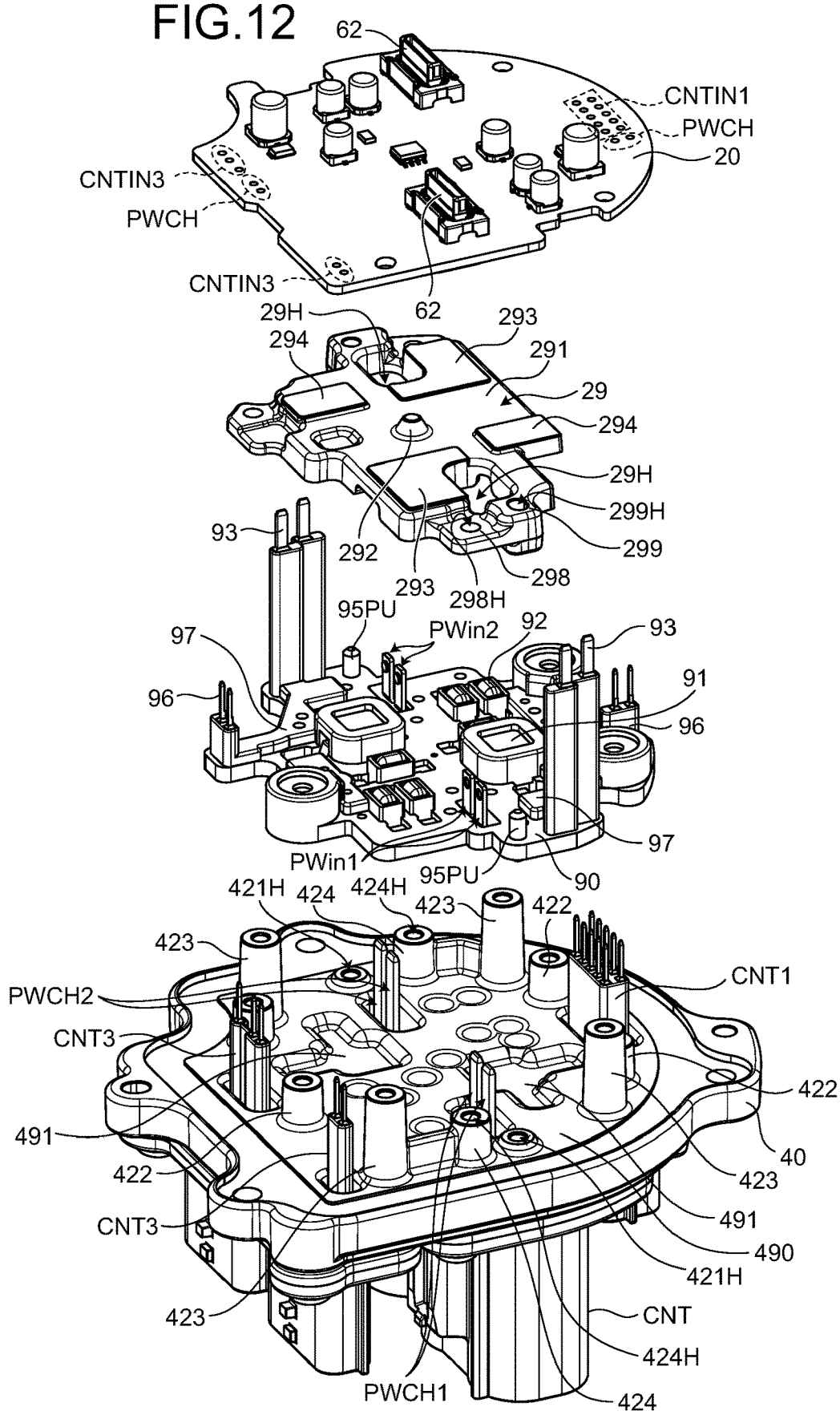
FIG. 12 is an exploded perspective view of a configuration example for attaching a control circuit board to a wiring module according to the embodiment.

FIG. 12 is an exploded perspective view of a configuration example for attaching the control circuit board to the wiring module according to the embodiment. As illustrated in FIG. 12, the ECU 10 includes the second circuit board 20 including the control circuit 24 that controls the first power circuit 25A and the second power circuit 25B including the field-effect transistors TR. The second circuit board 20 is disposed on the anti-load side of the second housing 11. The first circuit board 60 and the second circuit board 20 are electrically connected by the inter-board connector inserted into the first through hole 119 formed in the axial direction Ax in the second housing 11. With this configuration, both surfaces of the second housing 11 in the axial direction are used as heat dissipation surfaces, and the second housing 11 functions as a heat sink.

The second circuit board 20 is accommodated in the accommodation space 11R formed in the second housing 11. As a result, the size of the electric driving device 1 is reduced in the axial direction Ax.

The motor stator 931 includes the first motor coil wiring 321 connected to the first coil groups Gr1 and the second motor coil wiring 322 connected to the second coil group Gr2. Two terminal blocks 80 are provided, and a first terminal block 80 and a second terminal block 80 are disposed at positions sandwiching the support 70. The first terminal block 80 electrically connects the first motor coil wiring 321 to the first circuit board 60, and the second terminal block 80 electrically connects the second motor coil wiring 322 to the first circuit board 60. If the motor coil wiring is redundant, the size of the motor 30 is reduced in the radial direction by using a plurality of side surfaces of the support 70.

The second housing 11 and the support 70 are coupled by the fixing members B2, such as screws. If the terminal block 80 is pressed by the fixing member BM, such as a screw, the stress due to the pressing is transmitted to the support 70, the fixing members B2, and the second housing 11. As a result, the stress applied to the first circuit board 60 is further reduced.

Figure 13A:
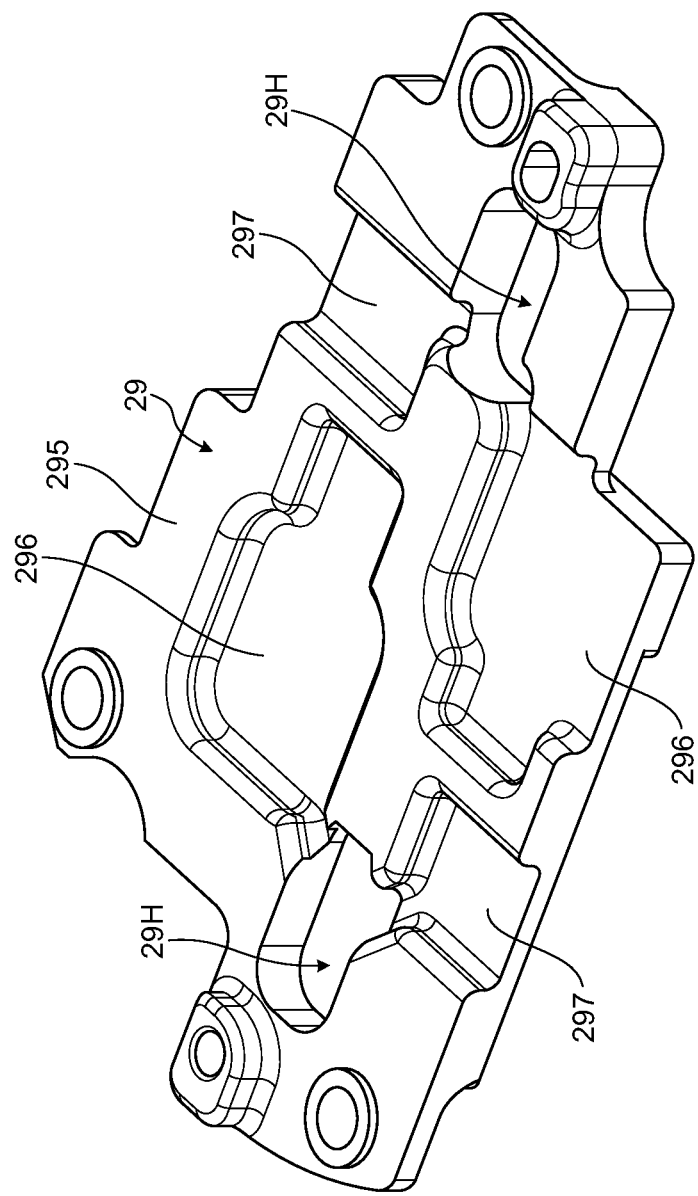
FIG. 13A is a top perspective view of a heat sink according to the embodiment.
Figure 13B:
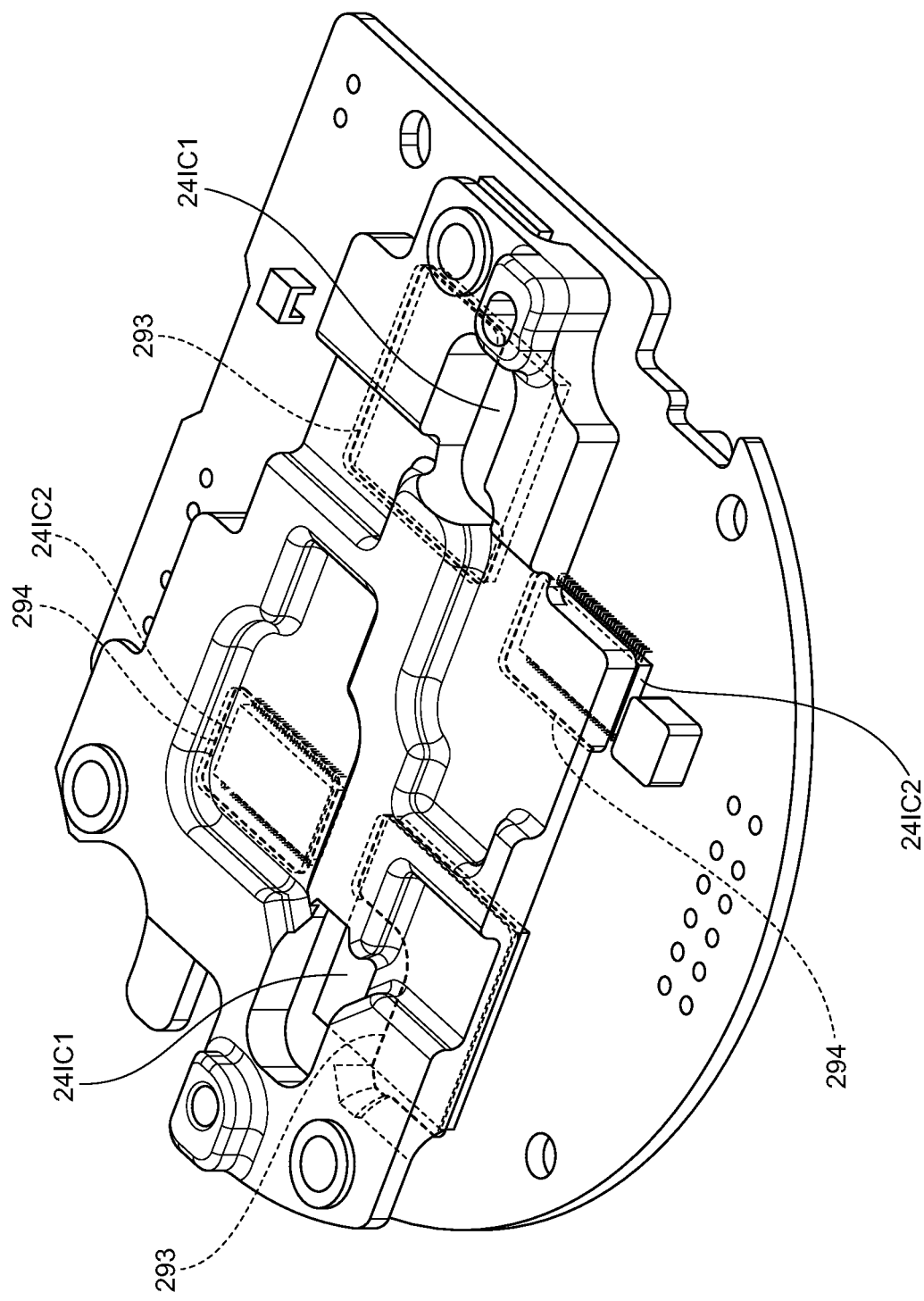
FIG. 13B is a view for explaining the positional relation between a heat dissipation surface of the heat sink and a second circuit board according to the embodiment.
Figure 13C:
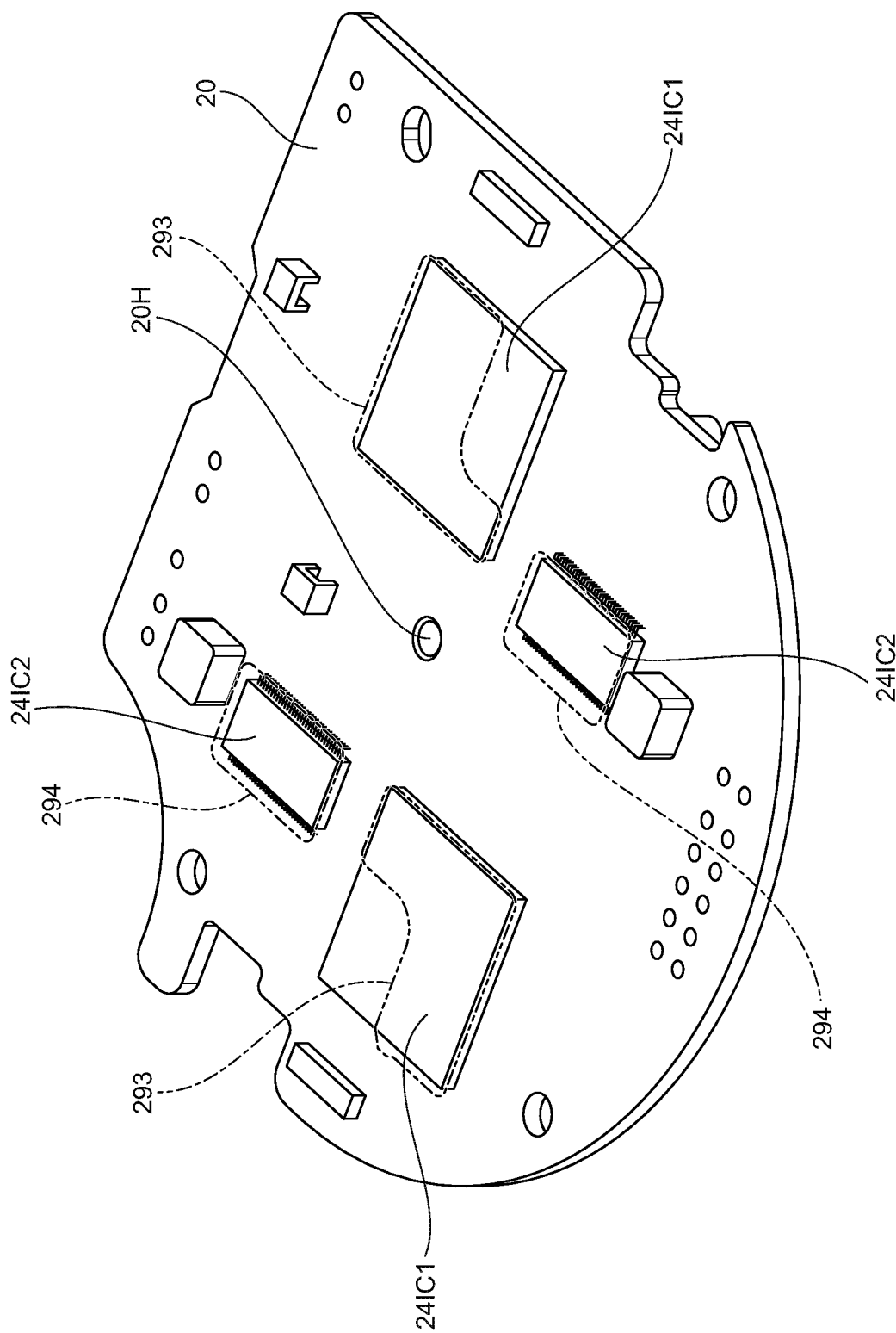
FIG. 13C is a top perspective view of the second circuit board according to the embodiment.
Figure 14:
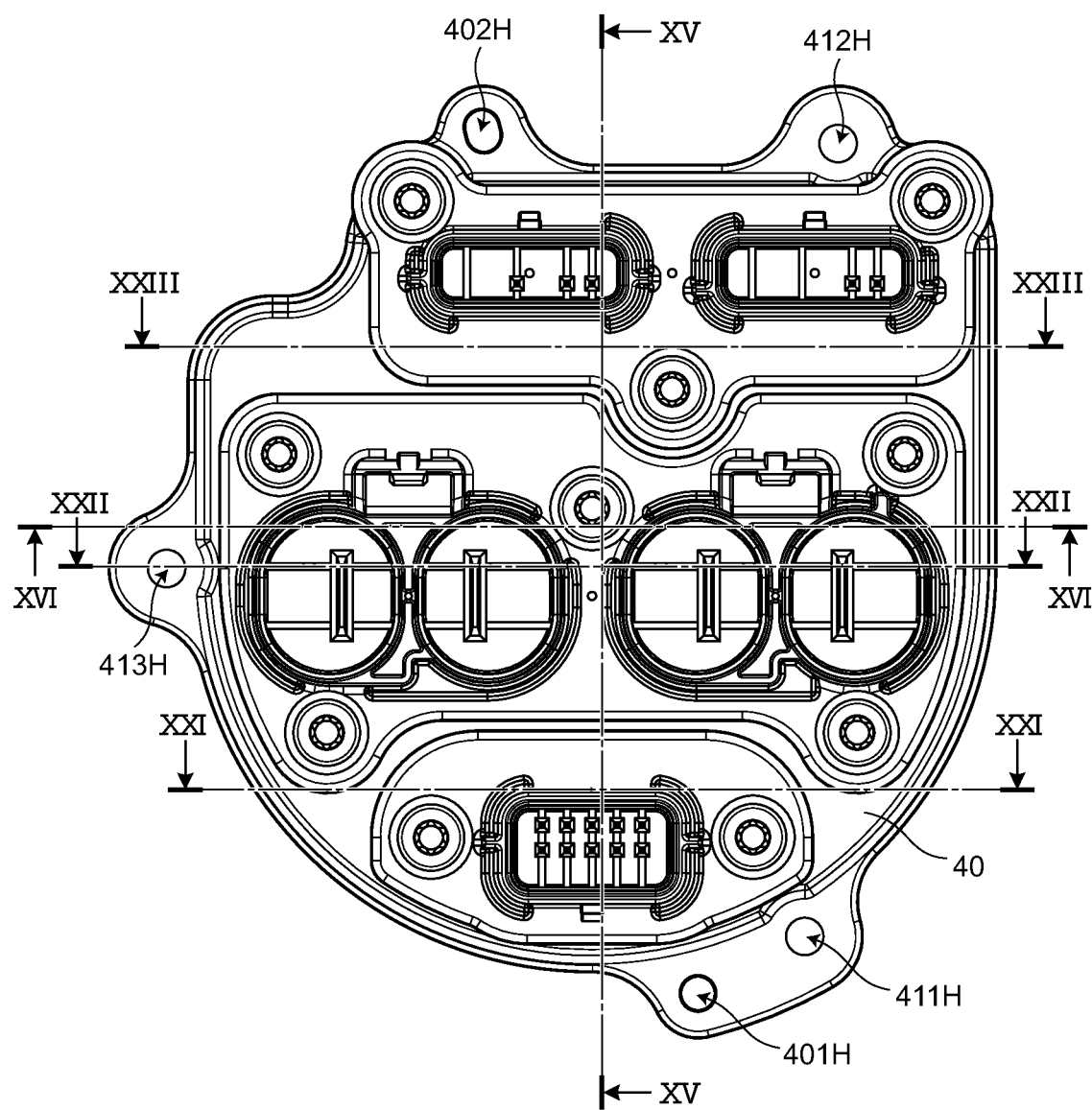
FIG. 14 is a plan view of an upper surface of a cover and a connector to which the second circuit board is attached according to the embodiment.
Figure 15:
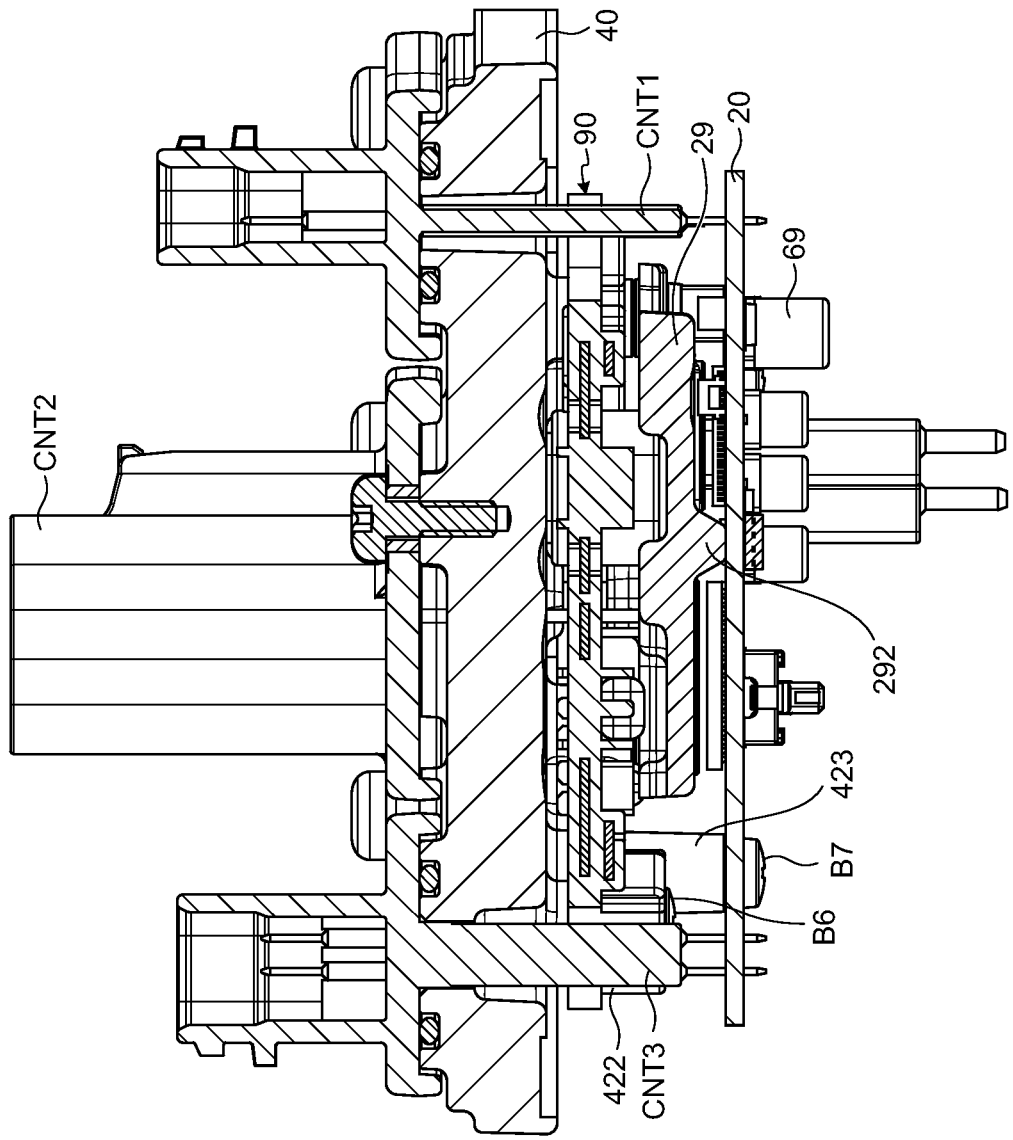
FIG. 15 is a sectional view along line XV-XV of FIG. 14.
Figure 16:
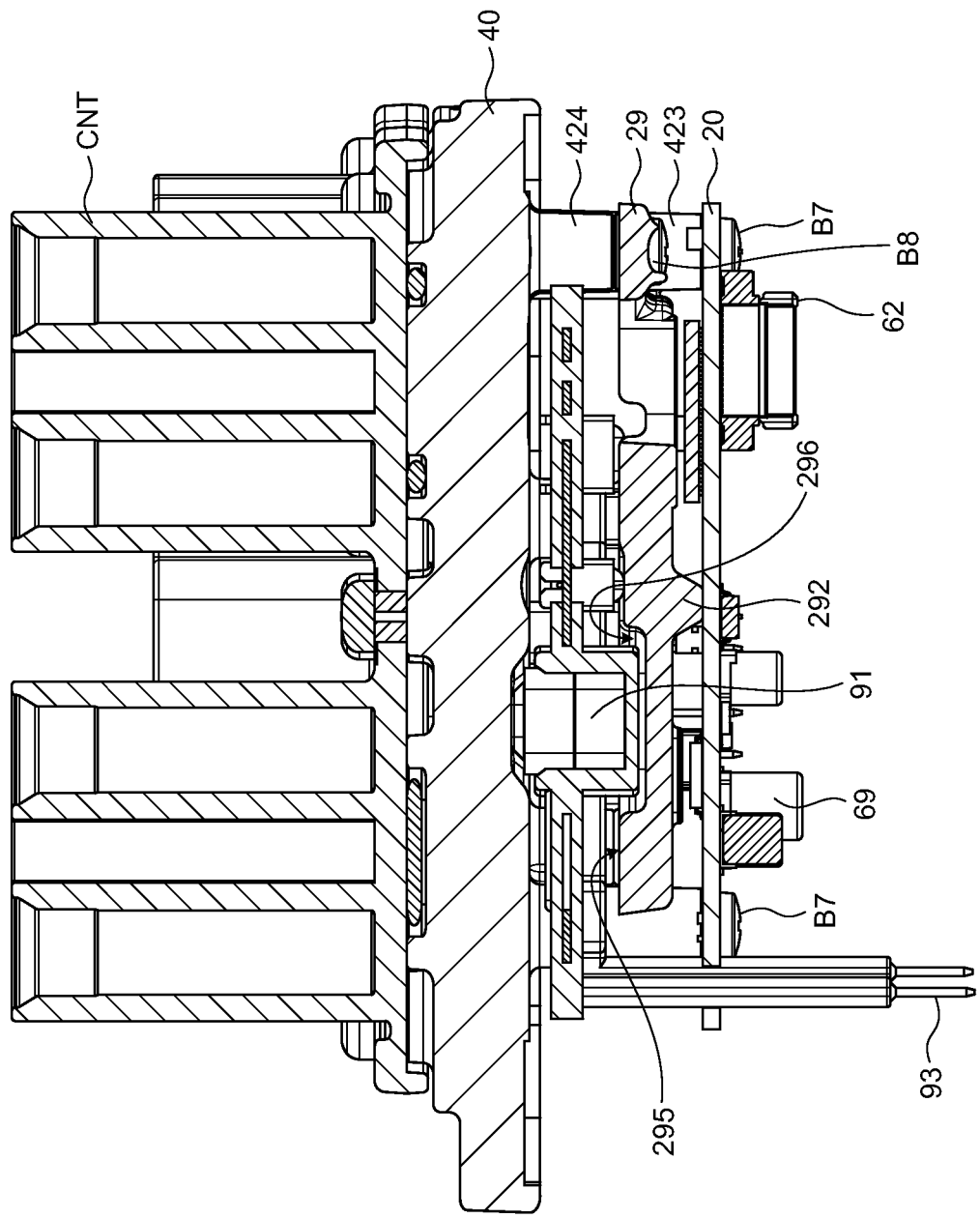
FIG. 16 is a sectional view along line XVI-XVI of FIG. 14.
Figure 17:
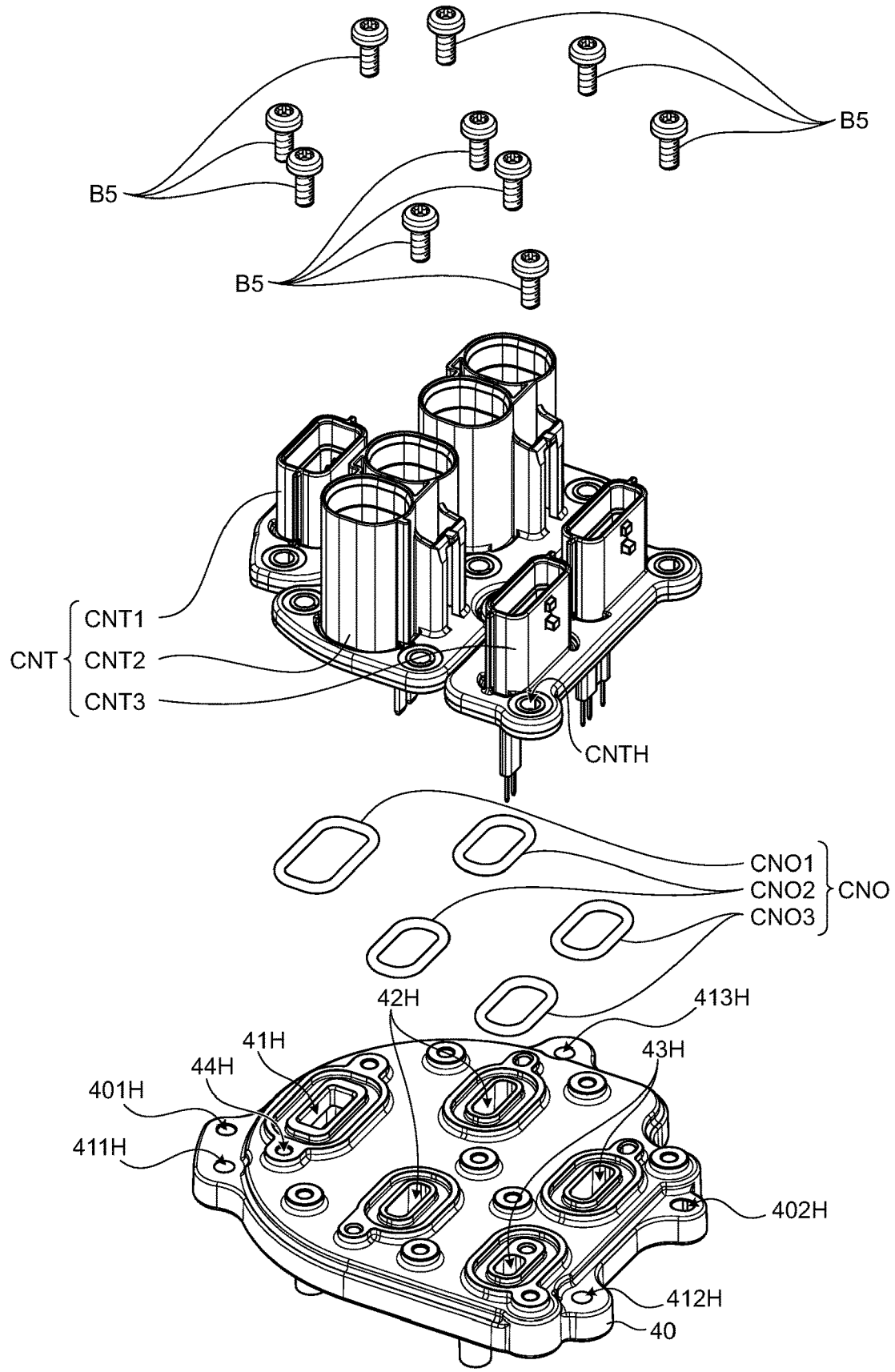
FIG. 17 is an exploded perspective view of a configuration example of the cover and the connector according to the embodiment.

FIG. 13A is a top perspective view of a heat sink according to the embodiment. FIG. 13B is a view for explaining the positional relation between a heat dissipation surface of the heat sink and the second circuit board according to the embodiment. FIG. 13C is a top perspective view of the second circuit board according to the embodiment. FIG. 14 is a plan view of an upper surface of a cover and a connector to which the second circuit board is attached according to the embodiment. FIG. 15 is a sectional view along line XV-XV of FIG. 14. FIG. 16 is a sectional view along line XVI-XVI of FIG. 14. FIG. 17 is an exploded perspective view of a configuration example of the cover and the connector according to the embodiment.

As illustrated in FIG. 12, the second circuit board 20 includes a plurality of electronic parts mounted on both surfaces of the board body. The board body of the second circuit board 20 is a printed circuit board made of resin, for example. The electronic parts mounted on one board body include a central processing unit (CPU), an application-specific integrated circuit (ASIC), a power management integrated circuit, capacitors, resistor elements, diodes, thermistors, and the receptacles 61, for example. These electronic parts constitute the control circuit 24 illustrated in FIG. 6.

The second circuit board 20 has through holes CNTIN1, through holes CNTIN3, and through holes PWCH.

The power supply wiring module 90 and the second circuit board 20 sandwich a heat sink 29. The heat sink 29 is made of metal. The heat sink 29 dissipates heat of choke coils 91 for noise removal and capacitors 92 of the power supply wiring module 90 and heat generated in the second circuit board 20.

As illustrated in FIG. 12, the heat sink 29 has a first base surface 291, a protrusion 292, heat dissipation surfaces 293, and heat dissipation surfaces 294. The first base surface 291 faces the second circuit board 20. The protrusion 292 and the heat dissipation surfaces 293 and 294 protrude from the first base surface 291 toward the second circuit board. The heat sink 29 has through holes 29H passing therethrough in the axial direction. Terminals of a connector CNT2 are disposed in the through holes 29H. This configuration prevents the terminal of the connector CNT2 from coming into contact with the heat sink 29 and short-circuiting.

The protrusion 292 has a conical trapezoidal shape. The protrusion 292 protrudes toward the second circuit board 20 with respect to the heat dissipation surfaces 293 and the heat dissipation surfaces 294.

As illustrated in FIG. 13A, the heat sink 29 has a second base surface 295, a recess 296, and a recess 297. The second base surface 295 faces the power supply wiring module 90. The recesses 296 and 297 are recessed from the second base surface 295 toward the second circuit board.

As illustrated in FIG. 12, the power supply wiring module 90 connects power wiring PW (refer to FIG. 2) that transmits electric power from the power supply unit 183 connected to the connector CNT2 (refer to FIG. 17) to lead frame wiring in the module and transmits the electric power to the first circuit board 60 and the second circuit board 20. The lead frame wiring is made of copper alloy, for example. The power supply wiring module 90 is provided with the choke coils 91 and the capacitors 92 to remove high-frequency components in the power wiring PW transmitted from the power supply unit 183. The resin of the power supply wiring module 90 is polybutylene terephthalate (PBT), for example.

As the electric power for driving the motor increases, it is necessary to increase power supply wiring in the board, resulting in an increase in the area of the board. For this reason, it is desirable to reduce the number of pieces of power supply wiring in the board. With the lead frame wiring in the power supply wiring module 90, the area of the power supply wiring in the first circuit board 60 is reduced. As a result, the area of the first circuit board 60 is reduced, whereby the size of the ECU 10 is reduced in the radial direction.

Input/output terminals of a connector CNT1, power supply input terminals PWCH1 and PWCH2 of the connector CNT2, and input/output terminals of a connector CNT3 pass through the lid 40 in the axial direction and protrude from the body of the lid 40 on the load side of the lid 40.

The input/output terminals of the connector CNT1 pass through the outside of the power supply wiring module 90 and the outside of the heat sink 29, are inserted into the through holes CNTIN1 of the second circuit board 20, and are electrically connected. Similarly, the input/output terminals of the connector CNT3 pass through the outside of the power supply wiring module 90 and the outside of the heat sink 29, are inserted into the through holes CNTIN1 of the second circuit board 20, and are electrically connected.

The lid 40 has positioning holes 421H and support protrusions 422, 423, and 424. The positioning holes 421H are recessed with respect to a reference surface 490 on the load side of the lid 40. The support protrusions 422, 423, and 424 protrude toward the load side.

The choke coil 91 is inserted into a recess 491 recessed with respect to the reference surface 490 on the load side of the lid 40. The bottom surface of the recess 491 serves as a heat dissipation surface for the choke coil 91 and one capacitor 92 with a heat dissipation material called TIM (thermal interface material) interposed therebetween.

As illustrated in FIGS. 12 and 13A, the second base surface 295 is a surface opposite to the first base surface 291 in the axial direction. The choke coil 91 and one capacitor 92 are inserted into the recess 296. The bottom surface of the recess 296 serves as a heat dissipation surface for the choke coil 91 and one capacitor 92 with a heat dissipation material called TIM (thermal interface material) interposed therebetween. Two capacitors 92 are inserted in the recess 297. The bottom surface of the recess 297 serves as a heat dissipation surface for the two capacitors 92 with a heat dissipation material called TIM (thermal interface material) interposed therebetween. With this configuration, cooling of the choke coils 91 for noise removal is promoted by the heat sink 29, and the size of the electronic control unit is reduced in the axial direction.

As described above, the heat sink has the first recess 296, and the lid 40 has the second recess 491. A first surface of the choke coil 91 protrudes from a first surface 90A of the power supply wiring module 90 and is inserted into the first recess 296. A second surface of the choke coil 91 protrudes from a second surface 90B opposite the first surface 90A and is inserted into the second recess 491. With this configuration, heat dissipation on both surfaces of the choke coil 91 is increased.

As illustrated in FIGS. 13B and 13C, the second circuit board 20 is provided with integrated circuits 24IC1 and integrated circuits IC24IC2 for power control. The heat dissipation surface 293 is provided at a position overlapping the integrated circuit 24IC1 in the axial direction. The heat dissipation surface 294 is provided at a position overlapping an integrated circuit 24IC4 in the axial direction. With this configuration, heat generated by the integrated circuits 24IC1 and IC24IC2 is efficiently transferred to the heat sink 29. The integrated circuits 24IC1 and the integrated circuits IC24IC2 for power control constitute the control arithmetic unit 241 (control circuit 24) illustrated in FIG. 6. Two integrated circuits 24IC1 and two integrated circuits IC24IC2 for power control are provided because two control arithmetic units 241 are independently provided as illustrated in FIG. 6. If one of the control arithmetic units 241 does not operate, the other one still functions, thereby increasing the functional continuity.

As illustrated in FIG. 13C, the second circuit board 20 has a recess 20H at the position facing the protrusion 292 of the heat sink 29. The recess 20H has such a size that the protrusion 292 can enter thereinto.

As illustrated in FIG. 14, the lid 40 has through holes 401H and 402H at positions overlapping the through holes 131H and 132H (refer to FIG. 7), respectively, in the axial direction. The through hole 401H is a round hole, whereas the through hole 402H is a long hole. The lid has through holes 411H, 412H, and 413H at positions overlapping the female threads 141K, 142H, and 143H, respectively, in the axial direction. The through holes 131H and 132H according to the present embodiment are also referred to as a third through hole. The through holes 401H and 402H are also referred to as a fourth through hole. The through holes 411H, 412H, and 413H are also referred to as a fifth through hole.

As illustrated in FIG. 15, the power supply wiring module 90 is fastened and fixed to the lid 40 by a fixing member B6, such as a bolt. As illustrated in FIG. 15, the second circuit board 20 is fastened and fixed to the lid 40 by a fixing member B7, such as a bolt. As illustrated in FIG. 16, the heat sink 29 is fastened and fixed to the lid 40 by a fixing member B8, such as a bolt. As a result, the power supply wiring module 90, the heat sink 29, and the second circuit board 20 are assembled with the lid 40 to form an upper assembly.

As illustrated in FIGS. 12 to 16, the integrated circuits 24IC1 and an integrated circuits 24IC2 face the first base surface 291, and the choke coils 91 for noise removal and the capacitors 92 of the power supply wiring module 90 face the second base surface 295. With this configuration, heat generated by the integrated circuits 24IC1 and the integrated circuits 24IC2 is transferred to the heat sink 29, thereby suppressing rise in temperature of the integrated circuits 24IC1 and the integrated circuits 24IC2. Heat generated by the choke coils 91 for noise removal and the capacitors 92 is transferred to the heat sink 29.

As illustrated in FIGS. 12, 15, and 16, the second circuit board 20, the heat sink 29, and the power supply wiring module 90 are attached to the lid 40. The second circuit board 20, the heat sink 29, and the power supply wiring module 90 have such sizes that they can be disposed inside the outer shape of the lid 40 when viewed in the axial direction. When the lid 40 is attached to cover the accommodation space 11R of the second housing 11, the second circuit board 20, the heat sink 29, and the power supply wiring module 90 are accommodated in the accommodation space 11R.

A communication terminal for CAN communications connected to the connector CNT3 (refer to FIG. 17) and an input/output terminal for inputting and outputting data of the torque sensor 194 (refer to FIG. 2) connected to the connector CNT1 (refer to FIG. 17) are directly connected to the second circuit board 20 not via the power supply wiring module 90.

As illustrated in FIG. 17, the connector CNT is divided into the connector CNT1, the connector CNT2, and the connector CNT3 by function. The connectors CNT1, CNT2, and CNT3 are attached to the lid 40 with sealing members CNO1, CNO2, and CNO3 such as O-rings, respectively, interposed therebetween. The connectors CNT1, CNT2, and CNT3 each have through holes CNTH passing therethrough in the axial direction Ax. The lid 40 has female threads 44H. Fixing members B5, such as bolts, pass through the through holes CNTH and are fastened to the respective female threads 44H. As a result, the connectors CNT1, CNT2, and CNT3 are fixed to the lid 40. The terminals of the connectors CNT1, CNT2, and CNT3 pass through through holes 41H, 42H, and 43H, respectively, formed in the axial direction Ax in the lid 40 and reach the other side of the lid 40.

The heat sink 29 is sandwiched between the power supply wiring module 90 and the second circuit board 20. The heat sink 29 is made of metal with high heat dissipation, such as aluminum and copper, and can dissipate heat of the second circuit board 20, the choke coils 91, and the capacitors 92.

Figure 18:
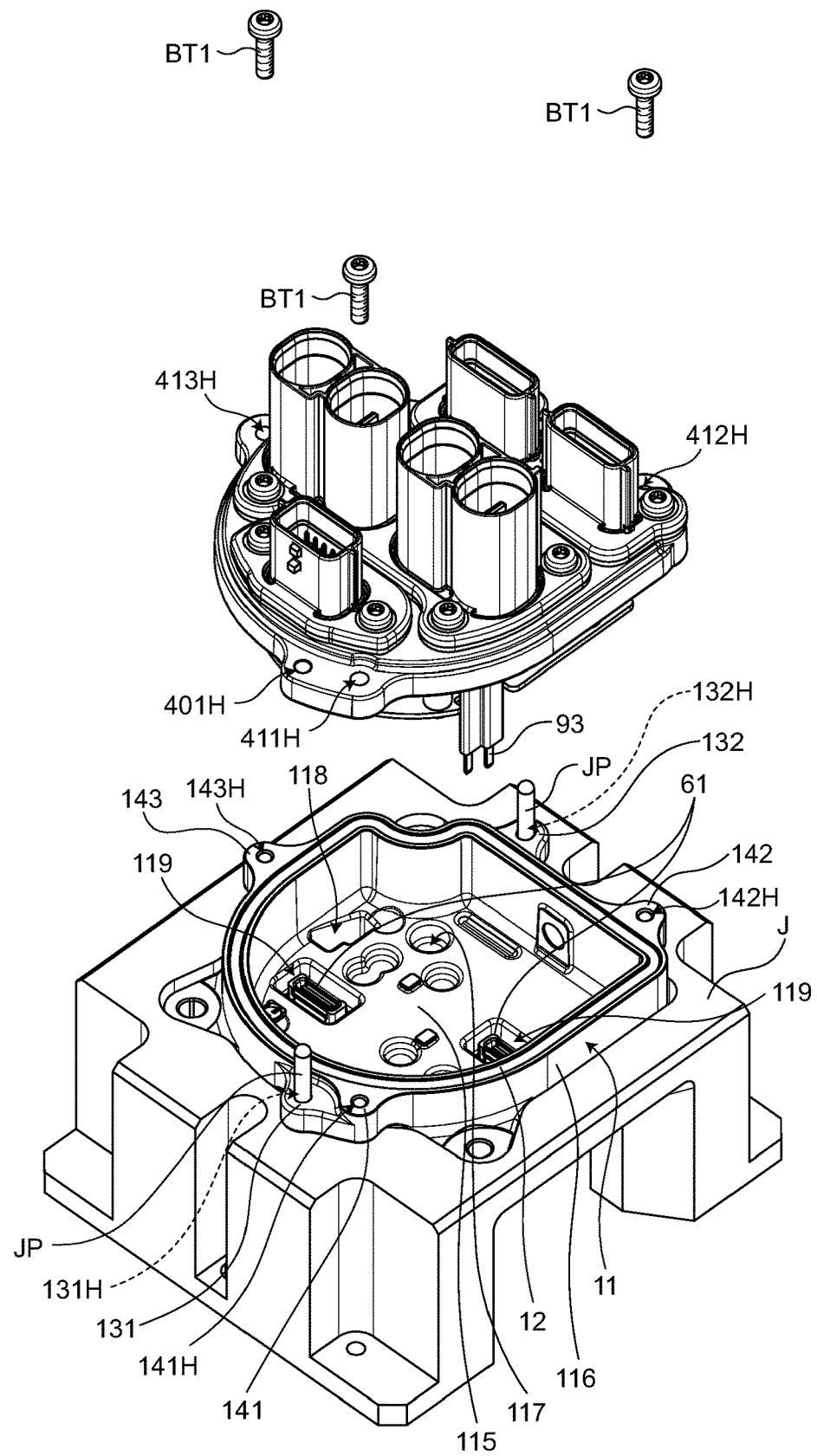
FIG. 18 is a view for explaining a jig for attaching a lid to a second housing according to the embodiment.

FIG. 18 is a view for explaining a jig for attaching the lid to the second housing according to the embodiment. The following describes a method for manufacturing the electronic control unit with reference to FIGS. 7, 9, and 18.

(Preparation Process)

In a preparation process, the first circuit board 60, the second circuit board 20, the second housing 11, and the lid 40 described above are prepared.

(First Process)

In a first process after the preparation process, the first circuit board 60 is fixed to the second housing 11 with the fixing members B2 as illustrated in FIG. 9. The receptacles 61 of the inter-board connector are inserted into and disposed in the respective first through holes 119.

(Second Process)

A jig J illustrated in FIG. 18 is prepared, and the second housing to which the first circuit board 60 is fixed in the first process is fitted into the jig J. Two pins JP protrude from the jig J and are inserted into the respective through holes 131H and 132H illustrated in FIG. 7. The two pins JP have such a length that they protrude from the flanges 131 and 132. The diameter of the through holes 131H and 132H is substantially equal to that of the pins JP. Therefore, the second housing 11 is positioned with respect to the jig J by the pins JP.

(Third Process)

Figure 19A:
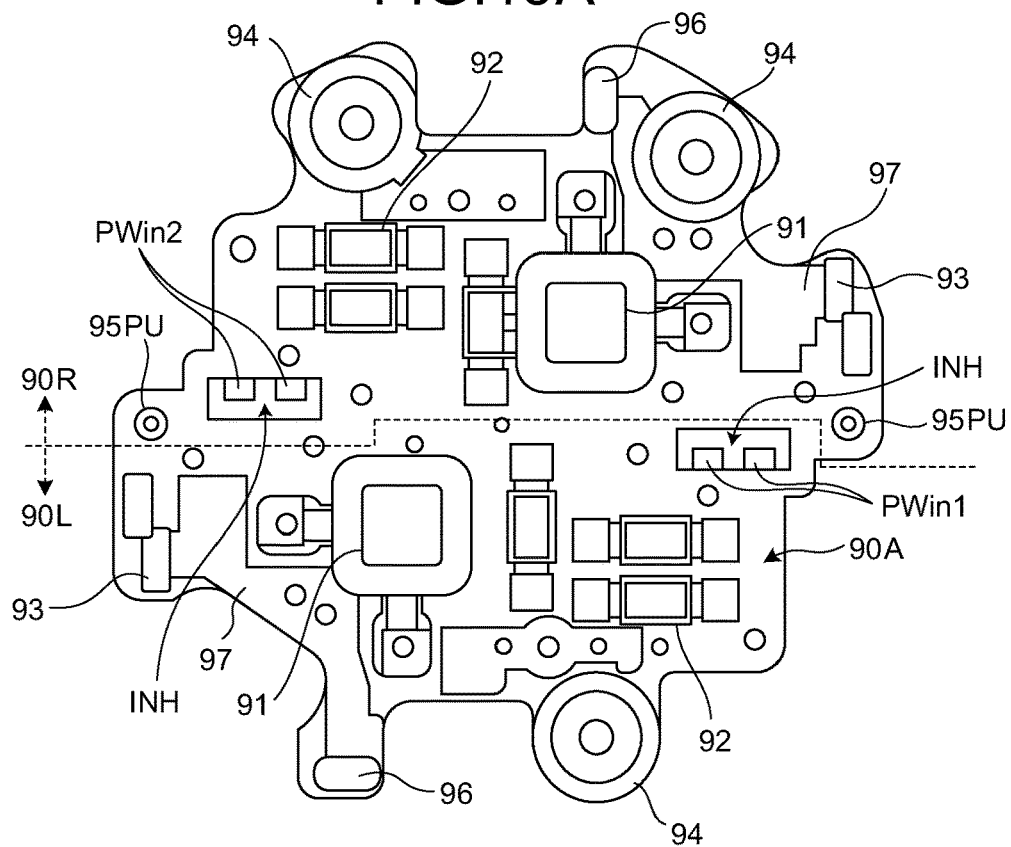
FIG. 19A is a plan view of an anti-load side of a power supply wiring module according to the embodiment.
Figure 19B:
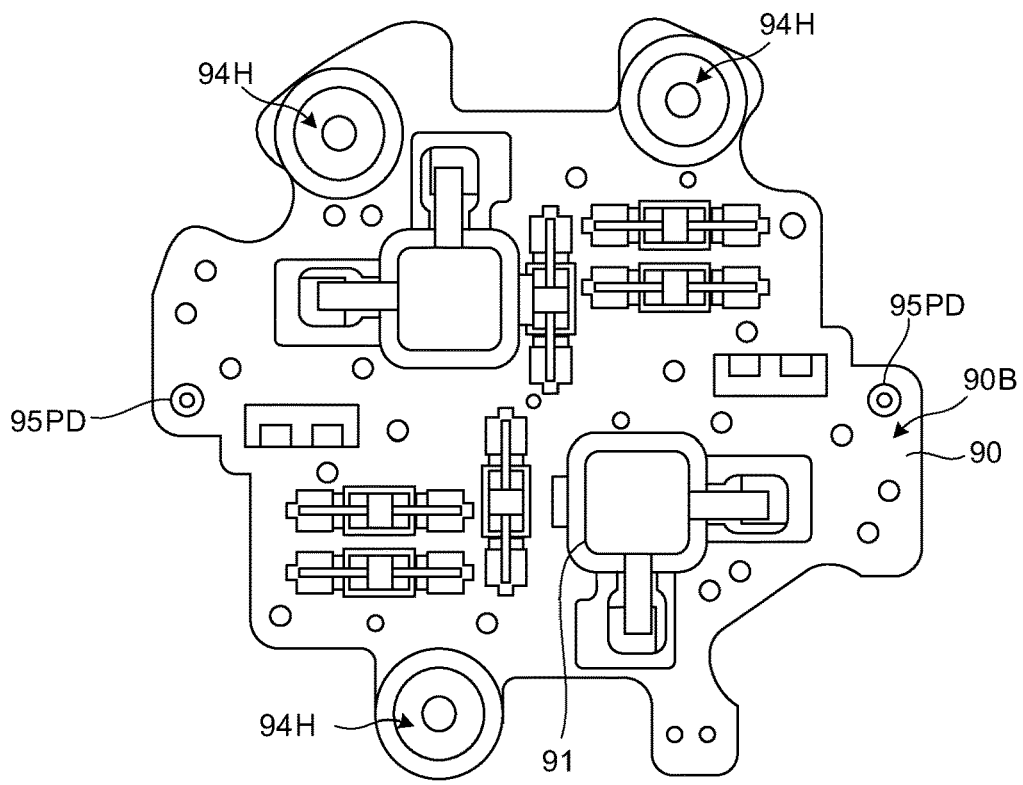
FIG. 19B is a plan view of a load side of the power supply wiring module according to the embodiment.
Figure 19C:
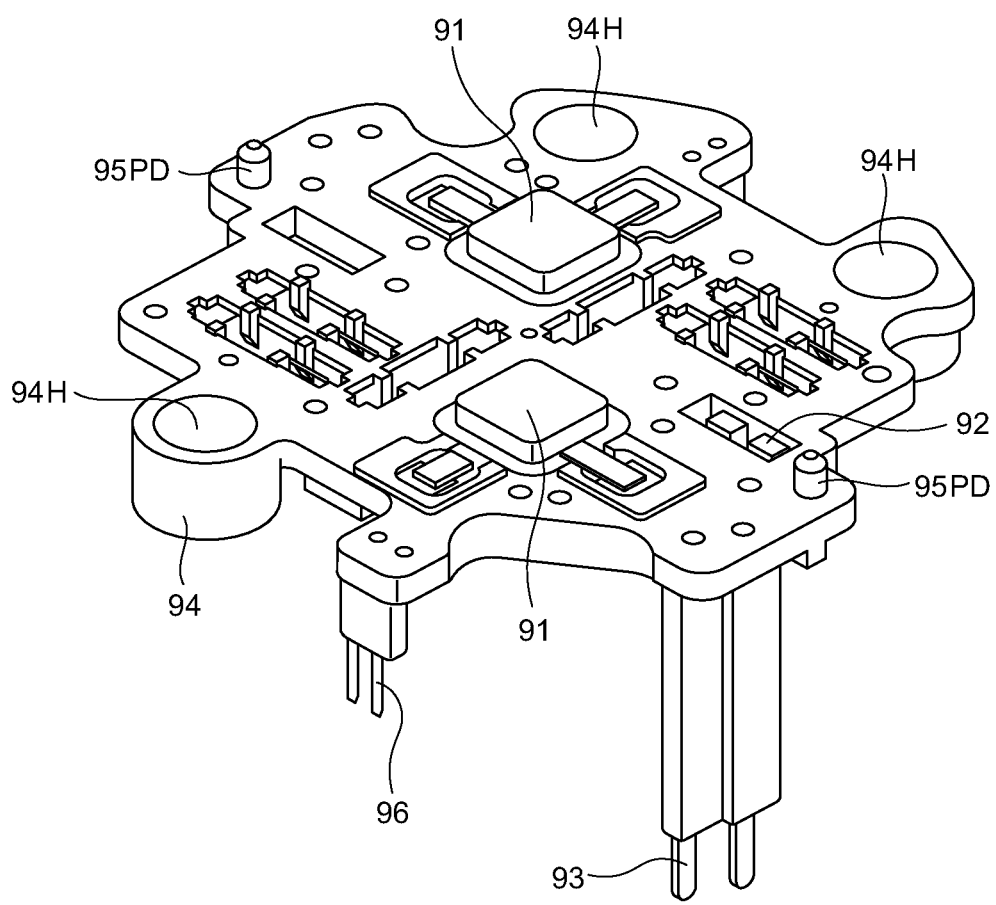
FIG. 19C is a perspective view of the power supply wiring module according to the embodiment.

In a third process after the preparation process, the second circuit board 20 is fixed to the lid 40 as illustrated in FIGS. 15 and 16. FIG. 19A is a plan view of the anti-load side of the power supply wiring module according to the embodiment. FIG. 19B is a plan view of the load side of the power supply wiring module according to the embodiment. FIG. 19C is a perspective view of the power supply wiring module according to the embodiment.

Specifically, the power supply wiring module 90 is attached to the lid 40 illustrated in FIG. 12. As illustrated in FIGS. 19A, 19B, and 19B, the power supply wiring module 90 integrates cylinders 94 that cover the respective support protrusions 422. Each cylinder 94 has a through hole at the center and has a hollow space 94H inside thereof. The cylinders 94 protrude not from the second surface 90B but from the first surface 90A of the power supply wiring module 90.

As illustrated in FIGS. 12, 19A, 19B, and 19B, the power supply wiring module 90 has second positioning protrusions 95PU protruding from the first surface 90A and first positioning protrusions 95PD protruding from the second surface 90B.

As illustrated in FIG. 12, the support protrusions 422 are inserted into the hollow spaces 94H (FIG. 19B) in the respective three cylinders 94. Subsequently, two first positioning protrusions 95PD (FIGS. 19B and 19C) are inserted into the respective two positioning holes 421H to position the power supply wiring module 90 with respect to the lid 40. As a result, the power supply wiring module 90 is less likely to come into contact with the power supply input terminal PWCH1 and other components. As illustrated in FIG. 15, the fixing member B6, such as a bolt, passes through the cylinder 94 and is fastened to a female thread formed on the top of the support protrusion 422.

As illustrated in FIGS. 12 and 19A, the power supply wiring module 90 includes first power supply terminals 93 and second power supply terminals 96 protruding from a first surface 90a. In the power supply wiring module 90, the resin of a base 97 of the first power supply terminals 93 and the second power supply terminals 96 is thicker than that of the part around the base 97. With this configuration, the first power supply terminals 93 and the second power supply terminals 96 are less likely to tilt with respect to the axial direction.

As illustrated in FIG. 19A, through holes INH for power input are formed in the resin in the spaces adjacent to power input units PWin1 and PWin2 of the lead frame wiring. When the power supply wiring module 90 is attached to the lid 40, the power supply input terminals PWCH1 and PWCH2 are inserted into the through holes INH. The power input unit PWin1 and the power supply input terminal PWCH1 are electrically connected by soldering or welding, and the power input unit PWin2 and the power supply input terminal PWCH1 are electrically connected by soldering or welding. As a result, the connector CNT2 and the power supply wiring module 90 can be electrically connected while securing insulation and reducing the thickness in the axial direction Ax.

Subsequently, the heat sink 29 is fixed to the lid 40. As illustrated in FIG. 12, the heat sink 29 has mounting portions 298, through holes 298H formed in the axial direction Ax in the respective mounting portions 298, positioning portions 299, and through holes 299H formed in the axial direction Ax in the respective positioning portions 299.

When the two second positioning protrusions 95PU of the power supply wiring module 90 are inserted into the two through holes 299H of the heat sink 29, the position of the heat sink 29 is determined with respect to the power supply wiring module 90. The mounting portion 298 comes into contact with the support protrusion 424, and the through hole 298H and a female thread 424H of the support protrusion 424 are aligned. When the fixing member B8, such as a bolt, illustrated in FIG. 16 is fastened to the female thread 424H (refer to FIG. 12) of the support protrusion 424, the lid 40 and the heat sink 29 are fixed together. The power supply input terminal PWCH1, the power supply input terminal PWCH2, and the power input units PWin1 and PWin2 are disposed in the through holes 29H, thereby suppressing short circuit between the heat sink 29 and the power supply wiring.

Subsequently, the second circuit board 20 is attached to the power supply wiring module 90. The second power supply terminals 96 are inserted into the through holes PWCH and are electrically connected. The input/output terminals of the connector CNT1 are inserted into the through holes CNTIN1 of the second circuit board 20 and are electrically connected. Similarly, the input/output terminals of the connector CNT3 are inserted into the through holes CNTIN1 of the second circuit board 20 and are electrically connected.

The second circuit board 20 comes into contact with and is supported by the support protrusions 423. As illustrated in FIGS. 15 and 16, the fixing member B7, such as a bolt, passes through the second circuit board 20 and is fastened to a female thread formed on the top of the support protrusion 423.

(Fourth Process)

After the second and the third processes, the pins JP protruding from the flanges 131 and 132 are caused to pass through the through holes 401H and 402H, respectively, in the lid 40 as illustrated in FIG. 18. When the lid 40 is moved closer to the second housing 11, the plug 62 of the inter-board connector approaches and is connected to the receptacle 61 exposed through the first through hole 119. Similarly, the first power supply terminal 93 is inserted into through holes PWPH (refer to FIG. 11) of the first circuit board 60 exposed through the second through hole 118. The pins JP regulate the positions of the second housing 11 and the lid 40, whereby the through holes 131H and 132H of the second housing 11 and the through holes 401H and 402H of the lid 40 serve as a reference for positioning. This configuration facilitates an operator's assembling the second housing 11 and the lid 40.

The first power supply terminal 93 is longer than the second power supply terminal 96. Therefore, electric power is supplied from the power supply wiring module 90 to both the first circuit board 60 and the second circuit board 20 disposed at different positions in the axial direction Ax.

(Fifth Process)

As illustrated in FIG. 18, fixing members BT1, such as male screws, pass through the through holes 411H, 412H, and 413H and are fastened to the female threads 141H, 142H, and 143H, thereby fixing the first housing 930 to the second housing 11. While the inter-board connector allows displacement of the plug 62 with respect to the receptacle 61, it is attached so as to suppress variation in the position of the plug 62 with respect to the receptacle 61. An electronic part 69, such as a capacitor, mounted on the second circuit board 20 illustrated in FIGS. 15 and 16 is inserted into the recess 117 formed in the bottom 115.

Figure 20:
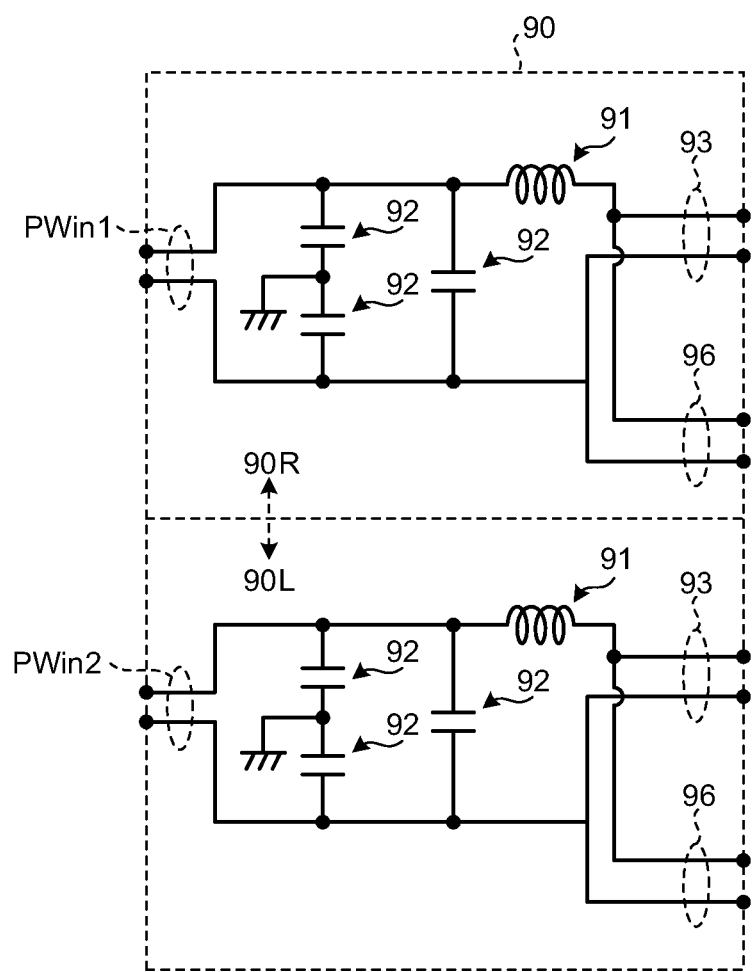
FIG. 20 is a circuit diagram of an equivalent circuit of the power supply wiring module according to the embodiment.

FIG. 20 is a circuit diagram of an equivalent circuit of the power supply wiring module according to the embodiment. As illustrated in FIGS. 19A and 20, a first power supply circuit 90R and a second power supply circuit 90L that are independently provided receive electric power from the different power input units PWin1 and Pwin2, respectively. The first power supply circuit 90R and the second power supply circuit 90L each include the circuits, such as the choke coil 91 and the capacitors 92. A noise-removed electrode is bifurcated into the first power supply terminal 93 that supplies electric power to the first circuit board 60 and the second power supply terminal 96 that supplies electric power to the second circuit board 20 in the power supply wiring module 90.

The first power supply terminal 93 of the first power supply circuit 90R is connected to the first power circuit 25A (refer to FIG. 6). The first power supply terminal 93 of the second power supply circuit 90L is connected to the second power circuit 25B (refer to FIG. 6).

The second power supply terminal 96 of the first power supply circuit 90R is connected to one of the control arithmetic units 241 (refer to FIG. 6). The first power supply terminal 93 of the second power supply circuit 90L is connected to the other of the control arithmetic units 241 (refer to FIG. 6).

As described above, the electric driving device 1 according to the embodiment receives electric power from two systems independently and drives two separate systems of the first coil group gr1 and the second coil group Gr2. Therefore, the electric driving device 1 has higher functional continuity.

Figure 21:
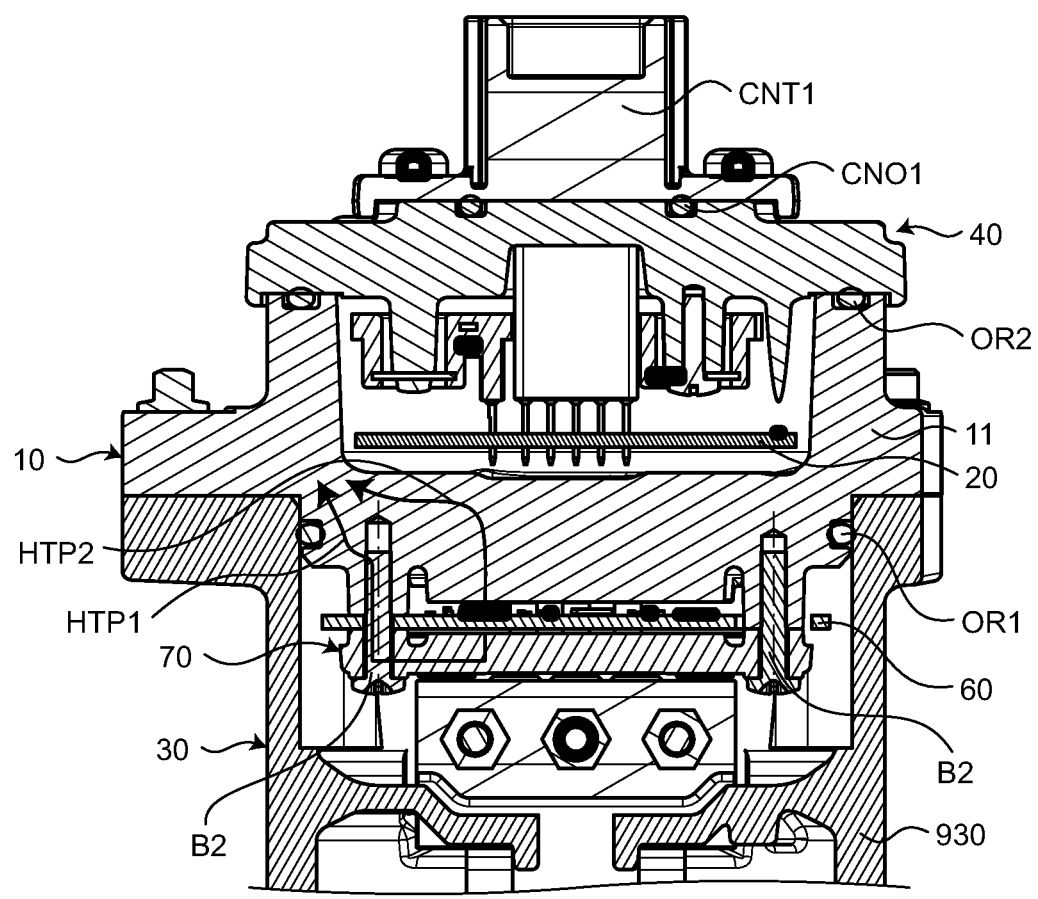
FIG. 21 is a sectional view seen from arrow XXI-XXI of FIG. 14.
Figure 22:
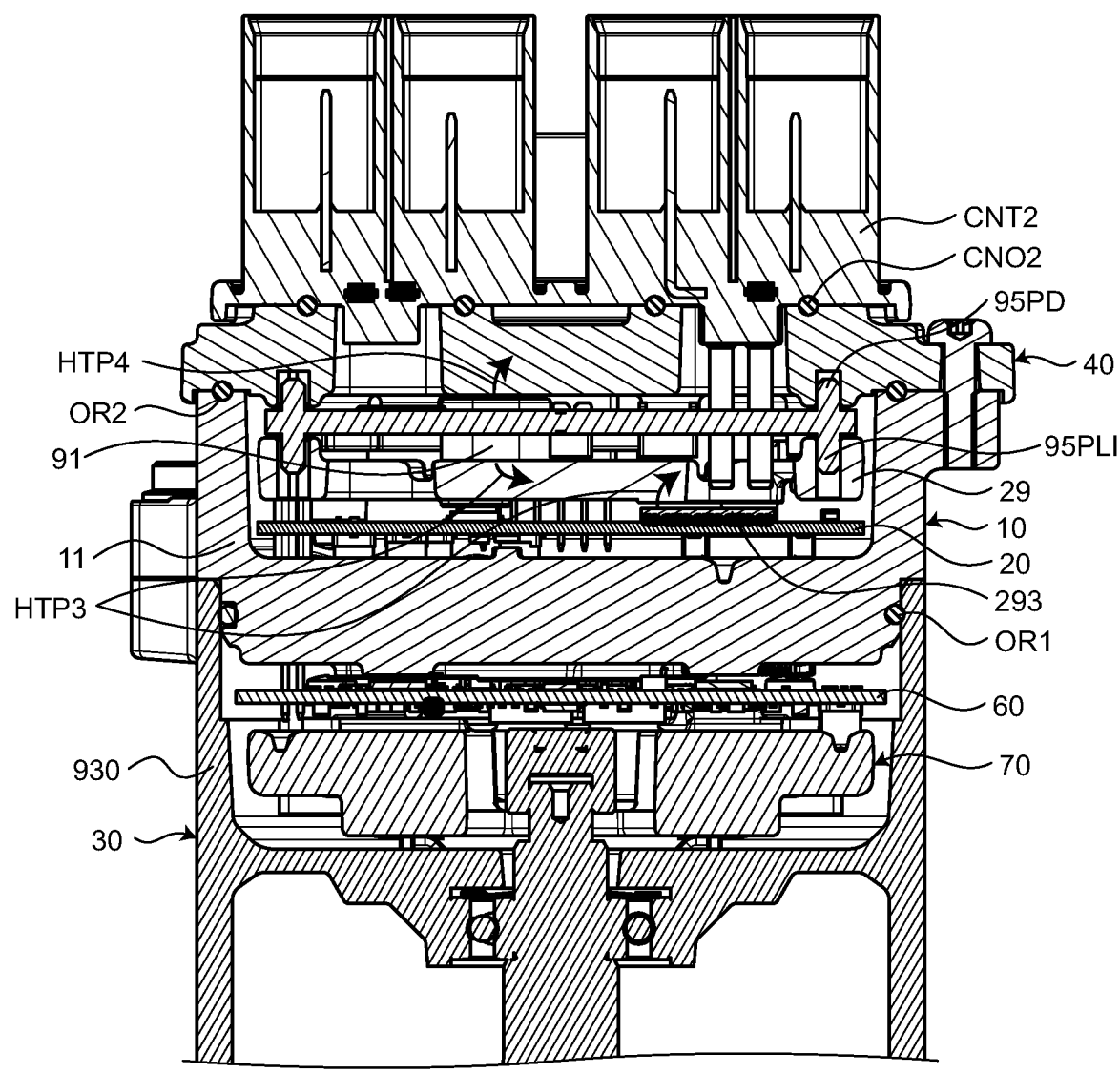
FIG. 22 is a sectional view seen from arrow XXII-XXII of FIG. 14.
Figure 23:
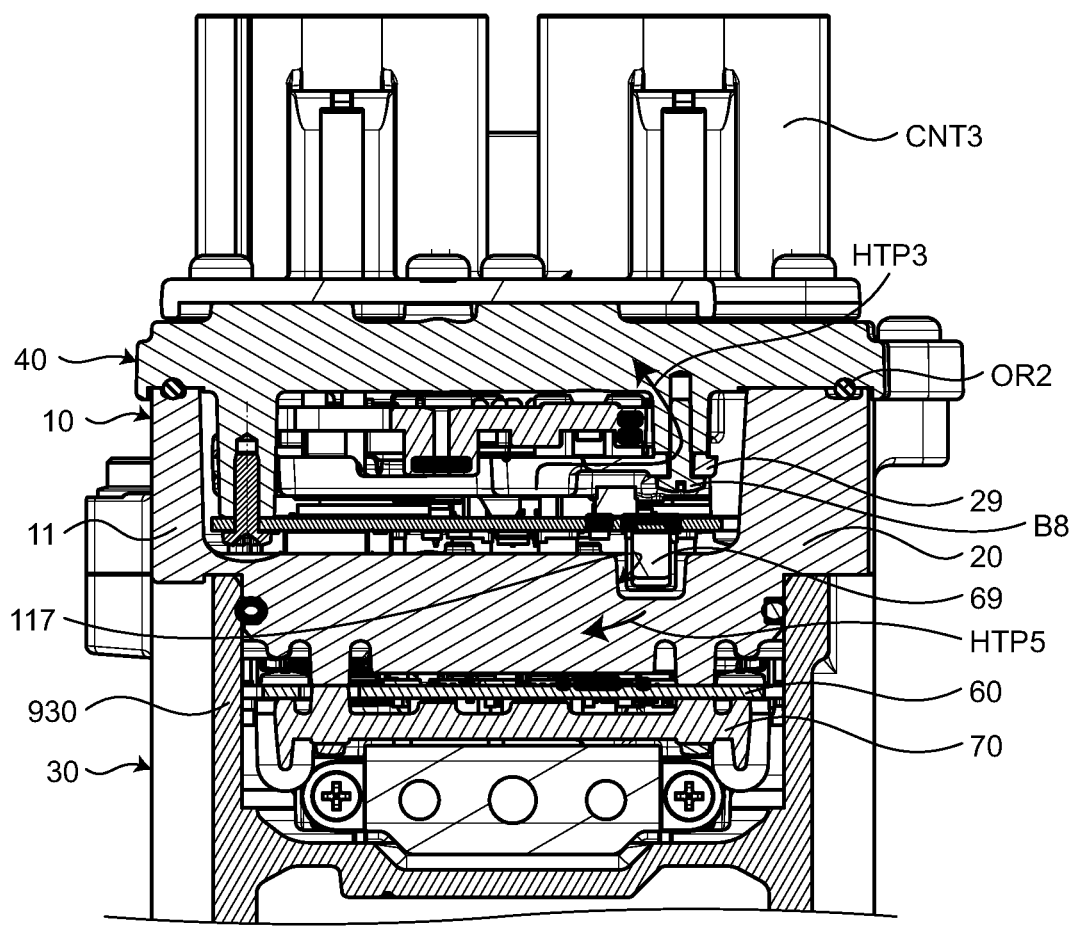
FIG. 23 is a sectional view seen from arrow XXIII-XXIII of FIG. 14.

FIG. 21 is a sectional view seen from arrow XXI-XXI of FIG. 14. FIG. 22 is a sectional view seen from arrow XXII-XXII of FIG. 14. FIG. 23 is a sectional view seen from arrow XXIII-XXIII of FIG. 14. Assuming that the electric driving device is disposed in the undercarriage of the vehicle 101, the electric driving device needs to have higher dust-proofness and waterproofness to prevent dust and water from entering the housing from the outside. For this reason, the inner peripheral surface of the first housing 930 and the outer peripheral surface of the second housing 11 are sealed with a sealing member OR1 (first sealing member) interposed therebetween as illustrated in FIGS. 21 to 23. The sealing member OR1 is what is called an O-ring made of rubber or elastomer. The anti-load-side end of the second housing 11 and the load-side end of the lid 40 are sealed with the sealing member OR2 (second sealing member) interposed therebetween. As a result, the sealability of the electric driving device is improved. With improved sealability, heat of the electronic parts of the first circuit board 60 and the second circuit board 20 is less likely to be released to the outside. For this reason, it is necessary to suppress rise in temperature in the electric driving device.

The support 70 serving as a heat sink has such an outer shape that it can enter into the inside of the first sealing member OR1 when viewed in the axial direction. Therefore, the support 70 can be accommodated inside the first housing 930. The heat sink 29 has such an outer shape that it can enter into the inside of the second sealing member OR2 when viewed in the axial direction. Therefore, the heat sink 29 can be accommodated inside the second housing 11. As a result, the electric driving device can be downsized while suppressing rise in temperature in the electric driving device.

The support 70 and the heat sink 29 have a limit in volume because they are accommodated inside the first housing 930 or the second housing 11. Therefore, the volume of the second housing 11 (heat sink) is made larger than that of the support 70 (heat sink), thereby increasing the heat capacity of the second housing 11 (heat sink). The support 70 is fixed to the second housing 11 (heat sink) by the metal fixing members B2 (first fixing member). In the first circuit board 60 and the second circuit board 20, electronic parts can be mounted on both surfaces. As illustrated in FIG. 21, heat of the electronic parts mounted on one surface of the first circuit board 60 is transferred to the second housing 11 (heat sink) by a first heat transfer path HTP1 via the support 70 and the fixing members B2. As a result, the support 70 is less likely to be thermally saturated. Heat of the electronic parts mounted on the other surface of the first circuit board 60 is transferred to the second housing 11 (heat sink) by a second heat transfer path HTP2.

As illustrated in FIG. 22, heat of the choke coils 91 for noise removal and the capacitors 92 of the power supply wiring module 90 is released to a third heat transfer path HTP3 for transferring heat to the heat sink 29 and a fourth heat transfer path HTP4 for transferring heat to the lid 40. Heat of one electronic part of the second circuit board 20 is transferred to the third heat transfer path HTP3 for transferring heat to the heat sink 29 (refer to FIG. 22), and heat of the other electronic part of the second circuit board 20 is transferred to a fifth heat transfer path HTP5 for transferring heat to the second housing 11 (refer to FIG. 23).

The volume of the lid 40 is made larger than that of the heat sink 29, thereby increasing the heat capacity of the lid 40. As illustrated in FIG. 23, heat of the heat sink 29 is transferred to the lid 40 by the third heat transfer path HTP3 via the metal fixing members B8 (second fixing member). As a result, the heat sink 29 is less likely to be thermally saturated.

As described above, the electric driving device 1 according to the embodiment includes the motor 30 and the ECU 10 provided on the anti-load side of the shaft 31 to drive and control the motor 30. The motor 30 includes the shaft 31, the motor rotor 932, the motor stator 931, and the first housing 930. The shaft 31 extends from the load side to the anti-load side in the axial direction Ax. Rotation of the motor rotor 932 synchronizes with rotation of the shaft 31. The motor stator 931 includes the first motor coils 37 and the second motor coils 38, and the first motor coil wiring 321 and the second motor coil wiring 322 for supplying electric power to the first motor coils 37 and the second motor coils 38, respectively, and rotates the motor rotor 932. The first housing 930 accommodates the motor rotor 932 and the motor stator 931. The magnet 32 for driving and controlling the motor 30 is provided on the anti-load side of the shaft 31.

The ECU 10 includes the first circuit board 60, the second housing 11, the support 70 serving as a second heat sink, and the terminal blocks 80. The first circuit board 60 is provided with the field-effect transistors TR and the rotation angle sensor 31a. The field-effect transistors TR output an electric current to excite the first motor coil 37 or the second motor coil 38. The rotation angle sensor 31a is disposed on an extension of the axial direction Ax of the shaft 31. The second housing 11 is provided on the anti-load side of the first circuit board 60. The support 70 is provided on the load side of the first circuit board 60 and sandwiches the first circuit board 60 between it and the second housing 11. The terminal block 80 is fixed to the contact surface 73 of the first side surface 74 of the support 70 serving as the second heat sink and electrically connects the first motor coil wiring 321 or the second motor coil wiring 322 to the first circuit board 60.

As a result, the first circuit board 60 is sandwiched between the second housing 11 and the support 70 serving as the second heat sink in the axial direction Ax. This configuration reduces the size of the motor 30 in the axial direction Ax parallel to the shaft 31 and makes the electric driving device 1 smaller. The terminal block 80 is fixed to and supported by the contact surfaces 73 of the first side surface 74 of the support 70. If the terminal block 80 is pressed by the fixing member BM, such as a screw, the stress due to the pressing is applied to the support 70, and the stress applied to the first circuit board 60 is reduced. As a result, the life of the first circuit board 60 is extended, and the reliability of the electric driving device 1 is improved.

The first housing 930 has the tool insertion hole 36H. The motor 30 includes the side cover 36 that covers the tool insertion hole 36H and is detachable from the first housing 930. Detaching the side cover 36 facilitates electrically connecting or disconnecting the motor 30 and the ECU 10.

In the first circuit board 60, the field-effect transistors TR are mounted on the second surface 60B facing the second housing 11, and the capacitors 253 and 256 serving as electrolytic capacitors are mounted on the first surface 60A facing the support 70. With this configuration, both surfaces of the first circuit board 60 are effectively used, and the first circuit board 60 can be downsized in the radial direction.

The support 70 has the first top plate 71 covering the capacitors 253. The magnet 32 is inserted into the through hole 76 in the axial direction formed in the top plate at a position not overlapping the capacitors 253. With this configuration, cooling of the capacitors 253 is provided by heat conduction to the first top plate 71. The first side surface 74 of the support 70 formed corresponding to the size of the capacitors 253 in the axial direction Ax can be used as the contact surfaces 73 in contact with the terminal block 80. The space outside the magnet 32 in the radial direction can also be used as an arrangement region for the capacitors 253 by inserting the magnet 32 at the position not overlapping the capacitors 253. As a result, the size of the electric driving device 1 is reduced in the axial direction Ax.

A step is formed between the first top plate 71 and the second top plate 79. With this configuration, the support 70 serves as a heat sink with the minimum volume corresponding to the size of the capacitors 253 and 256, thereby contributing to reduction in weight of the electric driving device 1.

The ECU 10 includes the second circuit board 20 including the control circuit 24 that controls the first power circuit 25A and the second power circuit 25B each including field-effect transistors TR. The second circuit board 20 is disposed on the anti-load side of the second housing 11. The first circuit board 60 and the second circuit board 20 are electrically connected by the inter-board connector inserted into the first through hole 119 formed in the axial direction Ax in the second housing 11. With this configuration, both surfaces of the second housing 11 in the axial direction can be used as heat dissipation surfaces.

The second circuit board 20 is accommodated in the accommodation space 11R serving as a recess formed in the second housing 11. As a result, the size of the electric driving device 1 is reduced in the axial direction Ax.

The motor stator 931 includes the first motor coil wiring 321 connected to the first coil groups Gr1 and the second motor coil wiring 322 connected to the second coil group Gr2. Two terminal blocks 80 are provided, and a first terminal block 80 and a second terminal block 80 are disposed at positions sandwiching the support 70. The first terminal block 80 electrically connects the first motor coil wiring 321 to the first circuit board 60, and the second terminal block 80 electrically connects the second motor coil wiring 322 to the first circuit board 60. If the coil wiring is redundant, the size of the motor 30 is reduced in the radial direction by using a plurality of side surfaces of the support 70.

The second housing 11 and the support 70 are coupled by the fixing members B2, such as screws. If the terminal block 80 is pressed by the fixing member BM, such as a screw, the stress due to the pressing is transmitted to the support 70, the fixing members B2, and the second housing 11. As a result, the stress applied to the first circuit board 60 is further reduced.

The ECU 10 includes the first circuit board 60, the second circuit board 20, the second housing 11, the lid 40, and the inter-board connector. The second housing 11 accommodates the second circuit board 20 and has the first through hole 119 passing therethrough in the axial direction Ax. The lid 40 covers the second housing 11. The first circuit board 60 is provided with the switching elements 252 and the rotation angle sensor 23a. The switching elements 252 are field-effect transistors that output an electric current to excite the motor coils. The rotation angle sensor 23a is disposed on an extension of the axial direction Ax of the shaft 31. The first circuit board is disposed on the anti-load side of the shaft 31. The second circuit board 20 includes the control circuit 24 that controls an electric current supplied to the switching elements 252. The inter-board connector connects the second circuit board 20 disposed on the anti-load side of the second housing 11 to the first circuit board 60 disposed on the load side of the second housing 11. The inter-board connector is disposed in the first through hole 119.

With this configuration, the inter-board connector reliably transmits control signals, and the second heat sink enhances heat dissipation of the first circuit board and the second circuit board.

The second housing 11 accommodates the second circuit board 20 and is sandwiched between the first circuit board 60 and the second circuit board 20. The second housing 11 serves as a heat sink that receives heat of the electronic parts of the first circuit board 60 and the second circuit board 20. The support 70 is provided on the anti-load side of the first circuit board 60 and serves as a heat sink that receives heat of the electronic parts of the first circuit board 60. The heat sink 29 is provided on the load side of the second circuit board 20 and receives heat of the electronic parts of the second circuit board 20. The lid 40 covers the anti-load side of the second housing 11, and the lid 40 and the second housing 11 surround the second circuit board 20, the heat sink 29, and the power supply wiring module 90.

Thus, the support 70 serving as the heat sink, the first circuit board 60, the second housing 11 serving as the heat sink, the second circuit board 20, the heat sink 29, the power supply wiring module 90, and the lid 40 are disposed in order in the axial direction. As a result, the sealability in the housing is improved while reducing the volume in the housing, and rise in temperature in the housing can be suppressed.

The ECU 10 includes the first circuit board 60, the second circuit board 20, the second housing 11, the lid 40, the connector CNT2, the power supply wiring module 90, and the heat sink 29. The second housing 11 accommodates the second circuit board 20. The lid 40 is made of metal and covers the second housing 11. The connector CNT2 includes the power supply input terminals PWCH1 and PWCH2 passing through the lid 40. The first circuit board 60 is provided with the switching elements 252 and the rotation angle sensor 23a. The switching elements 252 are field-effect transistors that output an electric current to excite the motor coils. The rotation angle sensor 23a is disposed on an extension of the axial direction Ax of the shaft 31. The first circuit board is disposed on the anti-load side of the shaft 31. The second circuit board 20 includes the control circuit 24 that controls an electric current supplied to the switching elements 252. The power supply wiring module 90 is configured by molding, with resin, the choke coils 91 for noise removal, the capacitors 92, the lead frame wiring, the first power supply terminals, and the second power supply terminals. The lead frame wiring has a first end connected to the power supply input terminal PWin and supplies electric power to the first circuit board 60 and the second circuit board. The first power supply terminals are connected to the first circuit board. The second power supply terminals are connected to the second circuit board. The heat sink 29 is sandwiched between the power supply wiring module 90 and the second circuit board 20, and the power supply wiring module 90 is sandwiched between the third heat sink 29 and the lid 40.

With this configuration, the area of the power supply wiring in the first circuit board 60 is reduced because the power supply wiring is provided in the power supply wiring module 90. As a result, the area of the first circuit board 60 is reduced, whereby the size of the ECU 10 is reduced in the radial direction. In addition, the power supply wiring module 90 is sandwiched between the second housing 11 and the heat sink 29, thereby enhancing heat dissipation of the choke coils 91. As a result, rise in temperature in the second housing 11 is suppressed.

The electric power steering device 100 includes the electric driving device 1 described above, and the electric driving device 1 generates auxiliary steering torque. This configuration reduces the size of the motor 30 in the axial direction Ax parallel to the shaft 31 and increases the flexibility in the arrangement of the electric power steering device 100. The electric power steering device 100 has higher reliability because the ECU 10 has higher reliability.

REFERENCE SIGNS LIST 1 electric driving device
10 ECU
11 second housing (heat sink)
11R accommodation space
12 sealing material
20 second circuit board
23 detection circuit
23a rotation angle sensor
24 control circuit
25A first power circuit
25B second power circuit
29 third heat sink
30 motor
30G gear
31 shaft
32 magnet
32A magnetic folder
36 side cover 36H tool insertion hole
37 first motor coil
38 second motor coil
40 lid
60 first circuit board
61 receptacle
62 plug
70 support (heat sink)
90 power supply wiring module
91 choke coil
92 capacitor
93 first power supply terminal
930 first housing (motor housing)
100 electric power steering device
101 vehicle
112 heat dissipation surface
113 recess
114 protrusion
114H female thread
118 second through hole
119 first through hole

The invention claimed is:

1. An electric driving device comprising a motor and an electronic control unit configured to control rotation of the motor, wherein
the motor comprises:
a shaft extending from a load side to an anti-load side in an axial direction;
a motor rotor configured to synchronize with the shaft;
a motor stator comprising a motor coil and motor coil wiring for supplying electric power to the motor coil and configured to rotate the motor rotor;
a first housing that accommodates the motor rotor and the motor stator; and
a magnet provided on the anti-load side of the shaft, and
the electronic control unit comprises:
a first circuit board provided with a transistor configured to output an electric current to excite the motor coil and a rotation angle sensor disposed on an extension of the axial direction of the shaft, the first circuit board being disposed on the anti-load side of the shaft;
a second circuit board comprising a control circuit configured to control an electric current supplied to the transistor;
a second housing that accommodates the second circuit board and has a first through hole passing through the second housing in the axial direction;
a lid that covers the second housing; and
an inter-board connector that is disposed in the first through hole and that connects the second circuit board disposed on the anti-load side of the second housing to the first circuit board disposed on the load side of the second housing such that the second housing accommodating the second circuit board is disposed between the first circuit board and the second circuit board.

2. The electric driving device according to claim 1, further comprising:
a power supply wiring module configured by molding, with resin, a choke coil for noise removal, a capacitor, and wiring configured to supply electric power to at least one of the first circuit board and the second circuit board, wherein
the second housing has a second through hole formed in the axial direction at a position different from a position of the first through hole, and
a power supply terminal extending from the power supply wiring module passes through the second through hole and is connected to the first circuit board.

3. The electric driving device according to claim 2, further comprising:
a heat sink sandwiched between the power supply wiring module and the second circuit board, wherein
the second housing accommodates the second circuit board, the heat sink, and the power supply wiring module.

4. The electric driving device according to claim 1, wherein
the second housing has a plurality of flanges extending outward in a radial direction of the second housing and a second through hole formed in at least one of the flanges, and
the lid has a third through hole at a position overlapping the second through hole in the axial direction in the lid.

5. The electric driving device according to claim 1, wherein
the second housing has a plurality of flanges extending outward in a radial direction of the second housing,
the second housing has a female thread formed in at least one of the flanges,
the lid has a second through hole at a position overlapping the female thread in the axial direction in the lid, and
the lid and the second housing are fixed by fastening a fixing member with a male thread passing through the second through hole to the female thread.

6. The electric driving device according to claim 1, wherein
the inter-board connector that comprises a receptacle attached to the first circuit board and a plug attached to the second circuit board connects the second circuit board disposed on the anti-load side of the second housing to the first circuit board disposed on the load side of the second housing such that the second housing accommodating the second circuit board is disposed between the first circuit board and the second circuit board.

7. An electric power steering device comprising:
an electric driving device according to claim 1, wherein the electric driving device generates auxiliary steering torque.

* * * * *